United States Patent [19]
Hisamoto et al.

[11] Patent Number: 6,027,629
[45] Date of Patent: Feb. 22, 2000

[54] VACUUM CHAMBER MADE OF ALUMINUM OR ITS ALLOYS, AND SURFACE TREATMENT AND MATERIAL FOR THE VACUUM CHAMBER

[75] Inventors: Jun Hisamoto; Koji Wada; Koki Ikeda; Masahiro Yanagawa, all of Kobe, Japan

[73] Assignee: Kabushiki Kaisha Kobe Seiko Sho, Kobe, Japan

[21] Appl. No.: 08/836,469

[22] PCT Filed: Nov. 6, 1995

[86] PCT No.: PCT/JP95/02263

§ 371 Date: May 16, 1997

§ 102(e) Date: May 16, 1997

[87] PCT Pub. No.: WO96/15295

PCT Pub. Date: May 23, 1996

[30]      Foreign Application Priority Data

Nov. 16, 1994 [JP] Japan .................................... 6-282313
Nov. 16, 1994 [JP] Japan .................................... 6-282314
Mar. 24, 1995 [JP] Japan .................................... 7-066231
Mar. 24, 1995 [JP] Japan .................................... 7-066232
Mar. 27, 1995 [JP] Japan .................................... 7-068232

[51] Int. Cl.$^7$ ................................................... C25D 11/12
[52] U.S. Cl. ............................ 205/50; 205/172; 205/175; 428/304.4; 428/305.5; 428/307.3
[58] Field of Search .............................. 205/50, 172, 175, 205/151, 106; 428/304.4, 305.5, 307.3; 148/415

[56]                References Cited

U.S. PATENT DOCUMENTS 3,622,473  11/1971  Toshiyuki et al. ...................... 204/38
3,862,892   1/1975  Lautenschlager et al. ............... 204/58
3,988,217  10/1976  Ikegaya .................................... 204/33
4,968,389  11/1990  Satoh et al. .............................. 204/15
5,039,388   8/1991  Miyashita et al. ...................... 204/192
5,077,105  12/1991  Frankfurter et al. .................... 428/34.6
5,132,003   7/1992  Mitani ..................................... 205/173
5,472,788  12/1995  Benitez-Garriga ................... 428/472.2
5,756,222   5/1998  Bercaw et al. .......................... 428/649

FOREIGN PATENT DOCUMENTS 60-197896  10/1985  Japan .
1-0110249   4/1989  Japan .
1-110235    4/1989  Japan .
4-206619    7/1992  Japan .
5-114582    5/1993  Japan .
5-53870     8/1993  Japan .

*Primary Examiner*—Kathryn Gorgos
*Assistant Examiner*—Erica Smith-Hicks
*Attorney, Agent, or Firm*—Oblon, Spivak, McClelland, Maier & Neustadt, P.C.

[57]              ABSTRACT

The present invention relates to a vacuum chamber and chamber parts made of aluminum or its alloys which exhibit excellent corrosion resistance to a corrosive gas or plasma introduced into the vacuum chamber, the surface treatment, and material for the vacuum chamber. The vacuum chamber has a porous layer with a structure in which a pore diameter at the top thereof is small, while a pore diameter at the bottom thereof is large. In order to give such a structure to the porous layer, a final anodizing voltage is set to be higher than an initial anodizing voltage when the surface of the base material is anodized. After the porous-type anodizing is completed, non-porous type anodizing may be conducted so as to grow a barrier layer. Furthermore, the base material made of aluminum alloy preferably has particles such as precipitates and/or deposits with a diameter of 10 $\mu$m or less in average, and the precipitates and/or deposits are arranged in parallel with a largest surface of the base material.

37 Claims, 6 Drawing Sheets

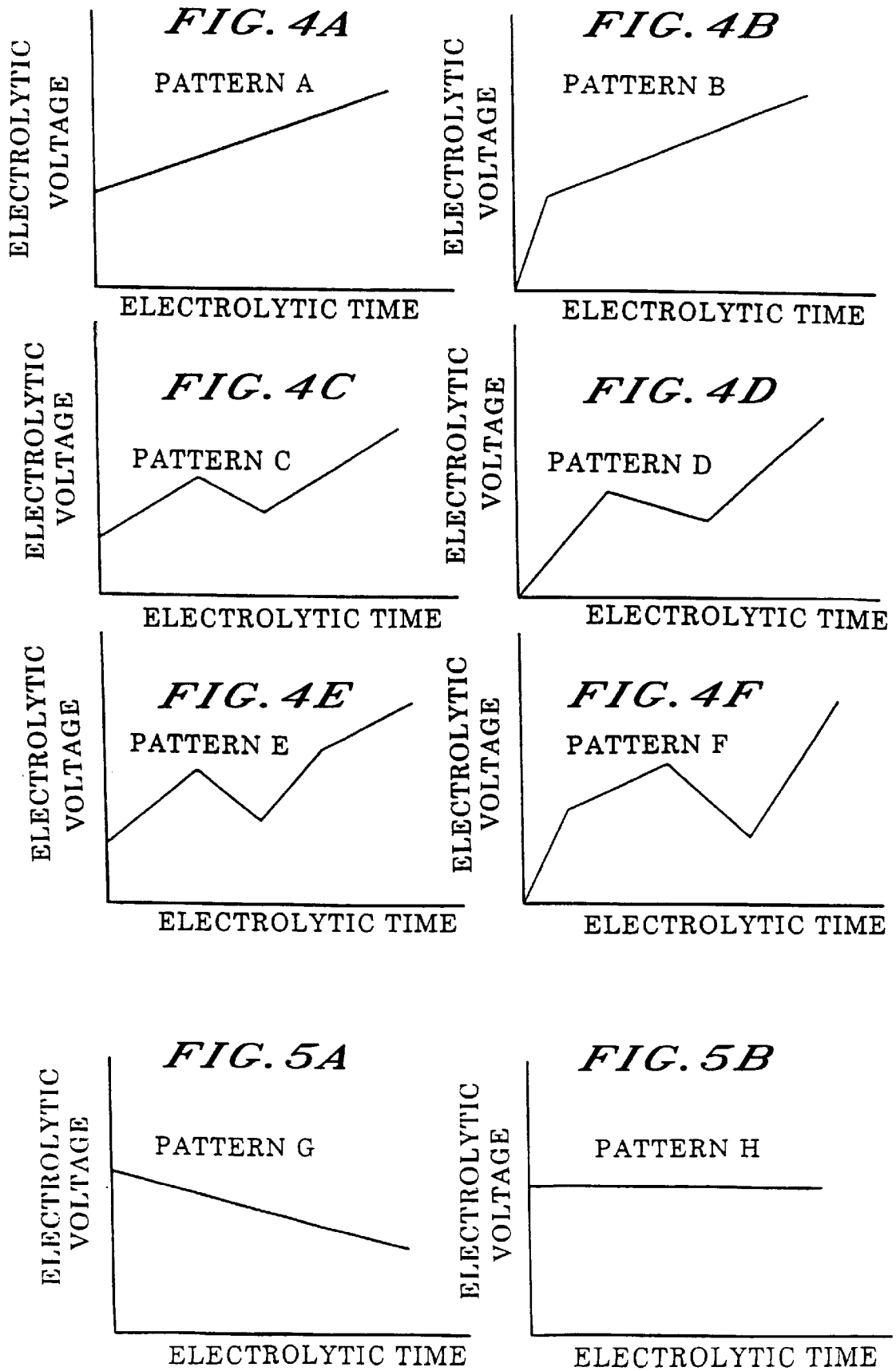

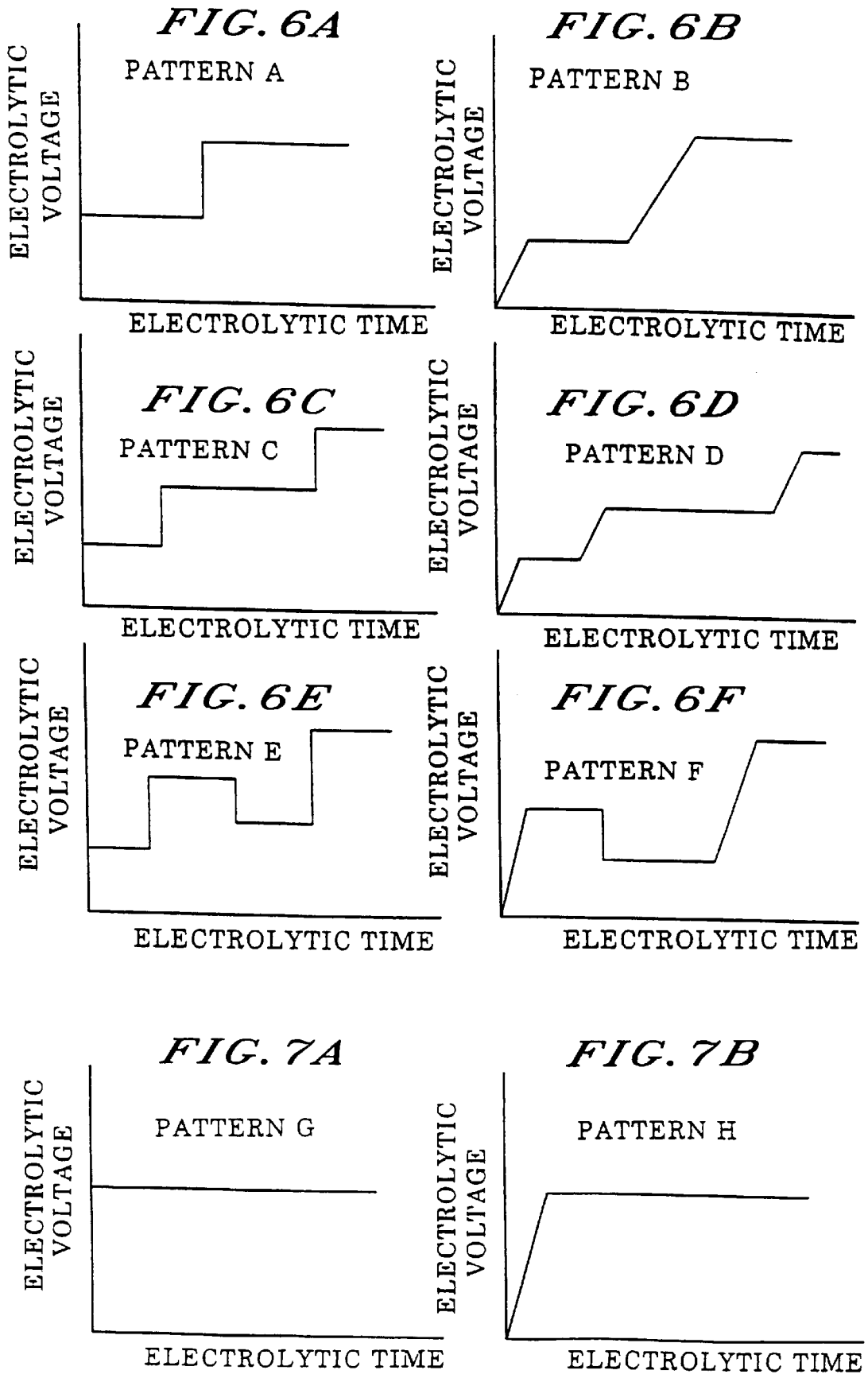

VACUUM CHAMBER MADE OF ALUMINUM OR ITS ALLOYS, AND SURFACE TREATMENT AND MATERIAL FOR THE VACUUM CHAMBER

This is a 371 of application Ser. No. PCT/JP95/02263, filed Nov. 6,1995.

FIELD OF THE INVENTION

The present invention relates to a vacuum chamber and chamber parts made of aluminum or its alloys used for a chemical vapor deposition device, a physical vapor deposition device, a dry etching device, and the like. The vacuum chamber and chamber parts exhibit excellent corrosion resistance to a corrosive gas or plasma introduced into the chamber. The present invention also relates to a surface treatment and material for the vacuum chamber and chamber parts.

BACKGROUND OF THE INVENTION

A vacuum chamber and chamber parts used for a chemical vapor deposition device, a physical vapor deposition device, a dry etching device, and the like are required to have corrosion resistance to a corrosive gas (hereinafter, referred to as gas corrosion resistance or resistance to gas corrosion), because a corrosive gas containing halogen elements such as chlorine, fluorine, bromine and the like are introduced into the chamber as a reactive gas, an etching gas, and a cleaning gas. In addition to the corrosive gas introduction, halogen-based plasma is generated in the chamber in many cases. Therefore, the vacuum chamber and chamber parts are also required to have corrosion resistance to plasma (hereinafter, referred to as plasma resistance).

To satisfy such requirements, conventionally, a vacuum chamber has been mainly made of stainless steel. However, a vacuum chamber made of stainless steel is heavy in weight, and therefore, requires large-scale foundation to support its construction. In addition, a vacuum chamber made of stainless steel does not have sufficient thermal conductivity, and therefore, much time is required for baking operation. There is also a problem that heavy metal such as chromium and nickel, which are alloy components of stainless steel, are released into the atmosphere during operation, resulting in spoilage the products treated in the vacuum chamber. Under such circumstances, studies have been conducted to develop a vacuum chamber and chamber parts made of aluminum or its alloys which is lighter in weight than those made of stainless steel and is excellent in thermal conductivity without the problem of heavy metal contamination.

However, without being subjected to surface treatment, a surface of aluminum or its alloys is not always excellent in resistance to gas corrosion and plasma. To give resistance to gas corrosion and plasma, any surface treatment is necessary. For this purpose, various studies have been conducted. For example, Japanese Patent Publication No. 5-53870 discloses a vacuum chamber which uses aluminum or its alloys whose surface is anodized to form an anodic oxide coating, thereby increasing gas corrosion resistance. However, no prior art, including the invention disclosed in Japanese Examined Patent Publication No. 5-53870, provides an anodic oxide coating which sufficiently serves as a protective coating against a corrosive gas and plasma. If an anodic oxide coating or a base material is corroded and damaged, products by the corrosion come out therefrom in a particle form. If a vacuum chamber or chamber part having such a coating layer or a base material is used in, for example, a semiconductor manufacturing, defective products may be produced. Accordingly, there has been a demand for improvement.

Japanese Patent publication No. 5-53871 discloses that an ion plating method is employed to form a coating (made of, for example, TiN, TiC, and the like) excellent in corrosion resistance on the surface of a vacuum chamber made of aluminum or its alloy. However, if the coating is formed by the vapor phase synthesis method such as ion plating, problems arise in that the obtained coating has small density and high cost is required for treatment. Japanese Patent Publication No. 5-53872 discloses an ion-implantation method. This method, however, is not adequate for treating a vacuum chamber or chamber part with a complicated form, and in addition, requires high cost for treatment as well as an ion plating method.

The present invention has been conducted to solve the above-described problems, and the first objective thereof is to provide a vacuum chamber or chamber part made of aluminum or its alloys excellent in resistance to gas corrosion and plasma by an economical anodizing method.

The second objective of the present invention is to provide a method for treating a surface the vacuum chamber and chamber parts.

The third objective of the present invention is to provide material used for producing the vacuum chamber and chamber parts.

SUMMARY OF THE INVENTION

To achieve the first objective, the present invention is directed to a vacuum chamber made of aluminum or its alloys comprising an anodic oxide coating including a porous layer having a number of pores and a barrier layer without pores (see FIG. 1 and FIG. 2). Each of pores has an opening on a surface, and its diameter is smaller at the top of the porous layer than at a bottom thereof. The thickness of the barrier layer is determined in accordance with a pore diameter in the porous layer which is formed immediately above the barrier layer. A barrier layer also can be formed by non-porous type anodizing as will be described later.

As described above, a pore diameter is smaller at the top of the porous layer than at a bottom thereof. The pores in the porous layer may have a section where its diameter continuously or discontinuously changes in a depth direction, or may have a section where its diameter remains constant in a depth direction.

When the anodic oxide coating contains two or more elements selected from the group consisting of carbon, sulfur, nitrogen, phosphorus, fluorine and boron, further corrosion resistance can be achieved.

Aluminum or its alloys used for producing a base material of the vacuum chamber or chamber part is produced in such a texture that particles such as precipitates and/or deposits contained therein have a diameter of 10 μm or less in average or are arranged in parallel with the largest surface of the base material. In this order, the base material itself gains further corrosion resistance as well as the anodic oxide coating. It is preferable that the precipitates and/or deposits have a diameter of 10 μm or less in average and also are arranged in parallel with the largest surface of the base material.

In the present invention, a vacuum chamber means not only a vacuum chamber itself, but also the vacuum chamber parts partially or entirely made of aluminum alloy such as gas diffusion plate(GDP), clamper, shower head, susceptor, clamp ring, electrostatic chuck, and the like. Hereinafter, a vacuum chamber is a general term for a vacuum chamber itself and such parts. The entire vacuum chamber is not necessarily made of aluminum alloys of the present invention, but may be made in combination with the aluminum alloy of the present invention and aluminum alloy produced by any other method than that of the present invention, conventionally known stainless steel, composite material of ceramics and plastics, and the like.

Hereinafter, there are some cases where the above-described vacuum chamber of the present invention is referred to as the first invention.

To achieve the second objective, the present invention is directed to a method for anodizing the surface of a vacuum chamber made of aluminum or its alloys. When the surface of vacuum chamber is anodized, a final anodizing voltage is set to be higher than an initial anodizing voltage.

When the final anodizing voltage is set to be higher than the initial anodizing voltage, the anodizing voltage is continuously or discontinuously changed for an arbitrary period, or may be kept constant for an arbitrary period.

The initial anodizing voltage is preferably 50V or less, and the final anodizing voltage is preferably 30V or more.

It is recommended that a solution containing oxalic acid is used as an anodizing solution, and 1 gram or more of oxalic acid is contained per 1 liter of solution. It is more preferable that the anodizing solution contains one or more elements selected from the group consisting of sulfur, nitrogen, phosphorus, fluorine and boron, or contains a compound including such elements.

In the present invention, an initial anodizing voltage indicates an electrolytic voltage applied when the formation of anodic oxide coating is substantially started. A final anodizing voltage indicates an electrolytic voltage applied when the formation of anodic oxide coating is substantially completed.

Hereinafter, there are some cases where the surface treatment method is referred to as the second invention.

As described above, to achieve the second objective, the surface of the vacuum chamber made of aluminum or its alloys is anodized so as to form an anodic oxide coating including a porous layer having a number of pores and a barrier layer without pores, and each of the pores has an opening on the surface. First, the surface of the vacuum chamber is subjected to a porous-type anodizing, and then, is subjected to a non-porous type anodizing. Hereinafter, there are some cases where such a surface treatment method is referred to as the third invention.

In the present invention, a porous-type anodizing indicates a normal anodizing by which a porous layer and a barrier layer are formed. The porous layer has a number of pores having an opening on the surface of the chamber, and the barrier layer has no pores and is formed on the interface between the porous layer and the base material. The porous-type anodizing is conducted by using a solution containing sulfuric acid, phosphoric acid, oxalic acid, chromic acid, or a mixture thereof as an electrolytic solution under the electrolytic voltage in the range between 5V and 200V.

The non-porous type anodizing indicates an anodizing by which a barrier layer with no pores is formed. The non-porous type anodizing is conducted by using a boron-base solution (for example, a solution containing a mixture of boron and ammonium borate,), a phosphorus-base solution (for example, an ammonium dihydrogenphosphate solution), a phthalic acid-base solution (for example, a potassium hydrogenphthalate solution), an adipic acid-base solution (for example, an ammonium adipate solution), a carbon-base solution (for example, a sodium carbonate solution), a citric acid solution, a tartaric acid solution, a sodium chromate solution, or a mixed solution thereof under the electrolytic voltage in the range between 60V and 500V.

To solve the third objective, the material used for producing the vacuum chamber of the present invention is made of aluminum alloys, and has precipitates and/or deposits having a diameter of 10 $\mu$m or less in average.

Instead of controlling the particle diameter, the precipitates and/or deposits may be arranged in such a texture as to be in parallel with the largest surface of the base material.

The material made of aluminum alloy gains further corrosion resistance by controlling both the particle diameter and the arrangement direction of the precipitates and/or deposits.

It is recommended that the precipitates and/or deposits have a volumetric proportion of 2% or less.

Hereinafter, there are some cases where the material used for the vacuum chamber of the present invention is referred to as the fourth invention.

In the present invention, precipitates indicate compounds generated from a liquid phase during the production of aluminum alloy. Deposits indicate compounds generated from a solid phase during the production of aluminum alloy. Kinds of precipitates and/or deposits depend on the composition of aluminum alloy, and are not limited by the series of aluminum alloy. Examples of precipitates and deposits are as follows.

Examples of precipitates generated in 1000-series aluminum alloy (hereinafter, 1000-series precipitates) include Al—Fe—series precipitates such as $Al_3Fe$, $Al_6Fe$ and the like, and Al—Fe—Si—series precipitates such as $\alpha$-AlFeSi, $\beta$-AlFeSi and the like.

Examples of precipitates generated in 2000-series aluminum alloy are of the identical kinds to 1000-series precipitates. Examples of deposits thereof include $Al_2Cu$, $Al_2CuMg$, $Al_6CuMg_4$ and the like.

Examples of precipitates generated in 3000-series aluminum alloy include, in addition to those identical kinds to the 1000-series precipitates, $Al_6Mn$, $Al_4Mn$, AlMn, $Al_{12}Mn$, $Al_{12}Fe_3Si$, $Al_{12}Mn_3Si$, $Al_9Mn_2S$ and the like. Deposits thereof is mainly $Al_6Mn$.

Examples of precipitates generated in 5000-series aluminum alloy include, in addition to those of identical kinds to the 1000-series precipitates, $Al_3Mg_2$, $Al_{12}Mg_{17}$, $Al_7Cr$, $Al_{18}Mg_3Cr_2$, $Al_{18}Mg_3Mn_2$ and the like. Examples of deposits thereof include $Al_3Mg_2$, $Al_2CuMg$ and the like.

Examples of precipitates generated in 6000-series aluminum alloy include, in addition to those of identical kinds to 1000-series precipitates, $Mg_2Si$, Si, $Al_8Mg_5$ and the like. Examples of deposits thereof include $Mg_2Si$, $Al_2CuMg$ and the like.

Examples of precipitates generated in 7000-series aluminum alloy include, in addition to those of identical kinds to 1000-series precipitates, $Al_8Mg_5$, AlZn, $Mg_2Zn_{11}$, $MgZn_2$ and the like. Examples of deposits thereof include $Mg_2Zn_{11}$, $MgZn_2$, $Al_2Mg_3Zn_3$, $Al_2CuMg$ and the like.

BRIEF DESCRIPTION OF THE DRAWINGS

FIG. 4 is a diagram illustrating the patterns of an electrolytic voltage applied in the surface treatment of the present invention;

FIG. 5 is a diagram illustrating the comparative examples of patterns of an electrolytic voltage applied in the surface treatment;

FIG. 6 is a diagram illustrating the patterns of an electrolytic voltage applied in the surface treatment of the present invention;

FIG. 7 is a diagram illustrating the comparative examples of patterns of an electrolytic voltage applied in the surface treatment;

BEST MODE FOR CARRING OUT THE INVENTION

A conventional vacuum chamber and chamber parts made of aluminum or its alloys has been poor in its corrosion resistance to the aforementioned corrosive gas and/or plasma. To solve this problem, the present inventors have conducted hard studies on the techniques for improving the surface quality of a vacuum chamber and chamber parts, and have reached the first invention. That is, when a vacuum chamber and chamber parts made of aluminum or its alloys is anodized, it is possible to control the internal structure and the composition of components of its anodic oxide coating, thereby remarkably enhancing the resistance to gas corrosion and plasma.

In a prior art, it is already known to control the thickness of anodic oxide coating in anodizing (for example, see Japanese Patent Publication No. 5-53870). It is also known to change the structure of anodic oxide coating by changing the conditions of electrolysis. However, there has been no attempt to suppress corrosion caused by a corrosive gas or plasma by controlling the internal structure or the composition of components of anodic oxide coating. In addition, there has been no report about studies conducted from such a point of view.

Figure 1:
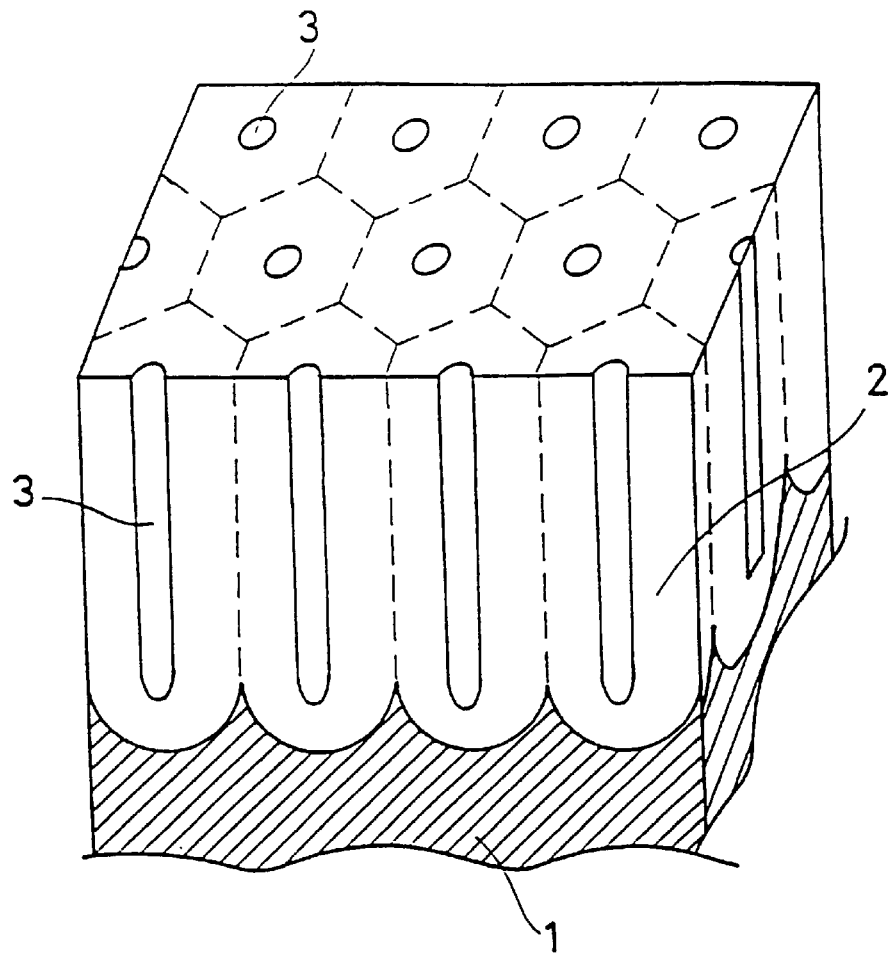
FIG. 1 is a partially sectional view schematically showing a structure of a porous-type anodic oxide coating.

FIG. 1 is a partially sectional view conceptually showing a schematic structure of an anodic oxide coating which is formed on the surface of a vacuum chamber or chamber part made of aluminum or its alloys by anodizing. When electrolysis is started, cells 2 grow in a base material 1 in the depth direction. Each of cells 2 has a pore 3 along the length thereof in the center portion.

Figure 2:
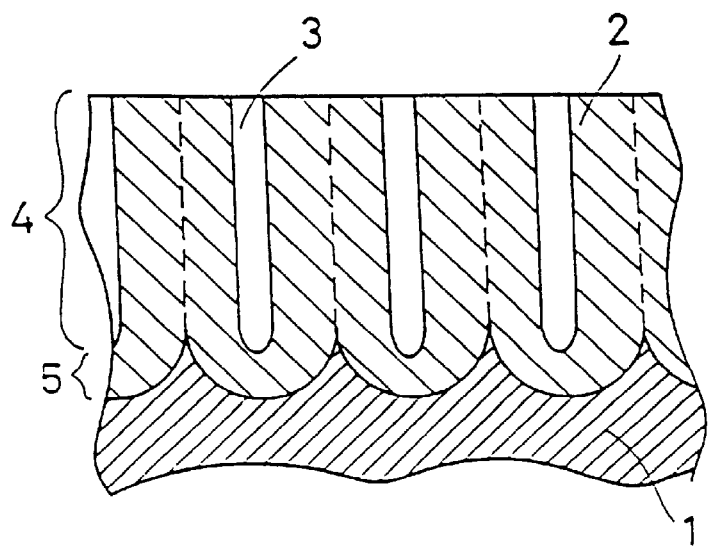
FIG. 2 is a cross-sectional view showing a porous-type anodic oxide coating.

FIG. 2 is a cross sectional view of the anodic oxide coating. In the present invention, the anodic oxide coating includes a porous layer 4 and a barrier layer 5. The porous layer 4 has pores 3, and the barrier layer 5 has no pores. The barrier layer 5 is interposed between the porous layer 4 and the base material 1. Having no permeability to gas, the barrier layer 5 prevents gas or plasma from coming into contact with the base material made of aluminum or its alloys.

It has been found that when an anodic oxide coating includes a porous layer and a barrier layer, there is a correlation among a pore diameter of the porous layer, a cell diameter thereof, and a thickness of the barrier layer.

The present inventors have studied the relationship between the structure and the resistance to gas corrosion and plasma of the anodic oxide coating. As a result, the present inventors have reached the following conclusions.

First, the anodic oxide coating exhibits more excellent plasma resistance as the porous layer has a pore diameter and a cell diameter smaller at the top thereof. The reason thereof is as follows. If the diameter of pores and cells is large at the top, plasma is likely to concentrate to the peripheries of pores on the surface of the anodic oxide coating. This makes micro-localized plasma condition on the surface of the anodic oxide coating. Contrary to this, if pores have openings with small diameter at the top, the uniformity of the surface of the anodic oxide coating is increased, so that the localized concentration of plasma can be prevented. In addition, the small pore diameter makes it difficult for gas and plasma components to penetrate into the anodic oxide coating, and to accumulate onto the surface of porous layer in the form of any compound.

Second, the anodic oxide coating exhibits more excellent resistance to gas corrosion as the porous layer has a pore diameter and a cell diameter larger at the bottom thereof. The reason thereof is as follows. If the diameter of pores and cells is large, a substantial surface area of inside the pore becomes small, so that an area capable of reacting with corrosive gas becomes small. Consequently, the internal structure of anodic oxide coating is hard to be adversely affected by the change in volume thereof due to reaction products.

Third, an anodic oxide coating exhibits more excellent resistance to gas corrosion as the thickness of barrier layer is larger. The reason thereof is as follows. As described above, the barrier layer prevents a corrosive gas from coming into contact with the base material made of aluminum or its alloys. However, there are some corrosive gases which will gradually penetrate into the barrier layer when the base material is left in such a gas atmosphere for a long time. Accordingly, it is desirable that the barrier layer has a large thickness in order to shield a corrosive gas and also to achieve excellent gas corrosion resistance even when the base material is left in a corrosive gas atmosphere for a long time.

From the above point of view, it is desirable that a porous layer has a structure in which a pore diameter at the top thereof is as small as possible, while a pore diameter at the bottom thereof is as large as possible so that a barrier layer has a large thickness.

The present invention does not limit the pore diameter to the specific value. In the present invention, at least the pore diameter at the bottom of the porous layer is larger than that at the top thereof, thereby enhancing the corrosion resistance. In order to achieve excellent plasma resistance, it is desirable that the pore 5 diameter at the top is 80 nm or less, and more preferably 50 nm or less, and the most preferably 30 nm or less. In order to achieve excellent gas corrosion resistance, it is desirable that a barrier layer has a thickness of 50 nm or more, and more preferably 80 nm or more.

Furthermore, in the present invention, it is enough that the pore diameter of the porous layer is larger at the bottom thereof than at the top thereof, and the pore diameter of the intermediate portion between the top and the bottom is not limited to the specific value. Therefore, the intermediate portion may include a section where its pore diameter continuously changes, a section where its pore diameter discontinuously changes, and a section where its pore diameter remains constant. These sections may be mixedly present in the intermediate portion. The pore may have a section with a decreased diameter in a way from the bottom to the top, or the pore may disappear in a way from the bottom to the top.

When a pore diameter continuously changes, there are various change patterns. For example, a pore diameter gradually increases from the top to the bottom, or may gradually increase from the top toward the base side, and then, decrease at any point, and after that, increase toward the bottom again.

In addition, the porous layer can have a multilayered structure, where two or more layers with a pore diameter different from each other are accumulated, so that the pore diameter of the porous layer gradually changes. In this case, it is desirable that the differences in the pore diameters among these layers are as small as possible, and that the layer positioned in the middle portion of the porous layer has pores whose diameter continuously change, so that the pores have tapered surfaces. The structure of porous layer may be selected depending on the application site in the vacuum chamber and chamber parts.

In the above description, the internal structure, specifically a pore diameter, of the anodic oxide coating changes in the depth direction. In this case, if the electrolysis is conducted while changing its conditions to change pore diameters, the surface of anodic oxide coating does not always have pores of uniform diameter. In many cases, the pore diameter is nonuniform depending on the shape of surface and the area where pores are formed. Therefore, the surface areas which require especially high plasma resistance can be selectively treated in such a manner as to have a diameter as small as possible. As a result, there may be some portions which do not satisfy the requirements of the present invention, but it is enough that the total structure of the anodic oxide coating satisfies the requirements of the present invention.

In some cases, pores are sealed after the completion of anodizing. This treatment is referred to as a pore sealing treatment. In the present invention, the pore sealing treatment can be conducted as far as it does not adversely affect the quality of the anodic oxide coating intended in the present invention. The pore sealing treatment is useful to achieve the coating performance as has been conventionally reported. Accordingly, as far as the entire structure of the anodic oxide coating satisfies the requirements of the present invention, it is possible to achieve the effect intended in the present invention.

In the present invention, the thickness of anodic oxide coating is not limited to a specific value; however, a preferable thickness to achieve excellent corrosion resistance is 0.05 $\mu$m or more, and more preferably 0.1 $\mu$m or more. In this case, if the anodic oxide coating has too large thickness, internal force is generated to cause cracks, resulting in insufficient coating quality or peeling. Therefore, the desirable upper limit of the thickness is 50 $\mu$m. In other words, with a thickness of more than 50 $\mu$m, it becomes difficult for the anodic oxide coating to reduce internal force by itself. This may cause the anodic oxide coating to crack and peel off, resulting in generating defective products.

Figure 3:
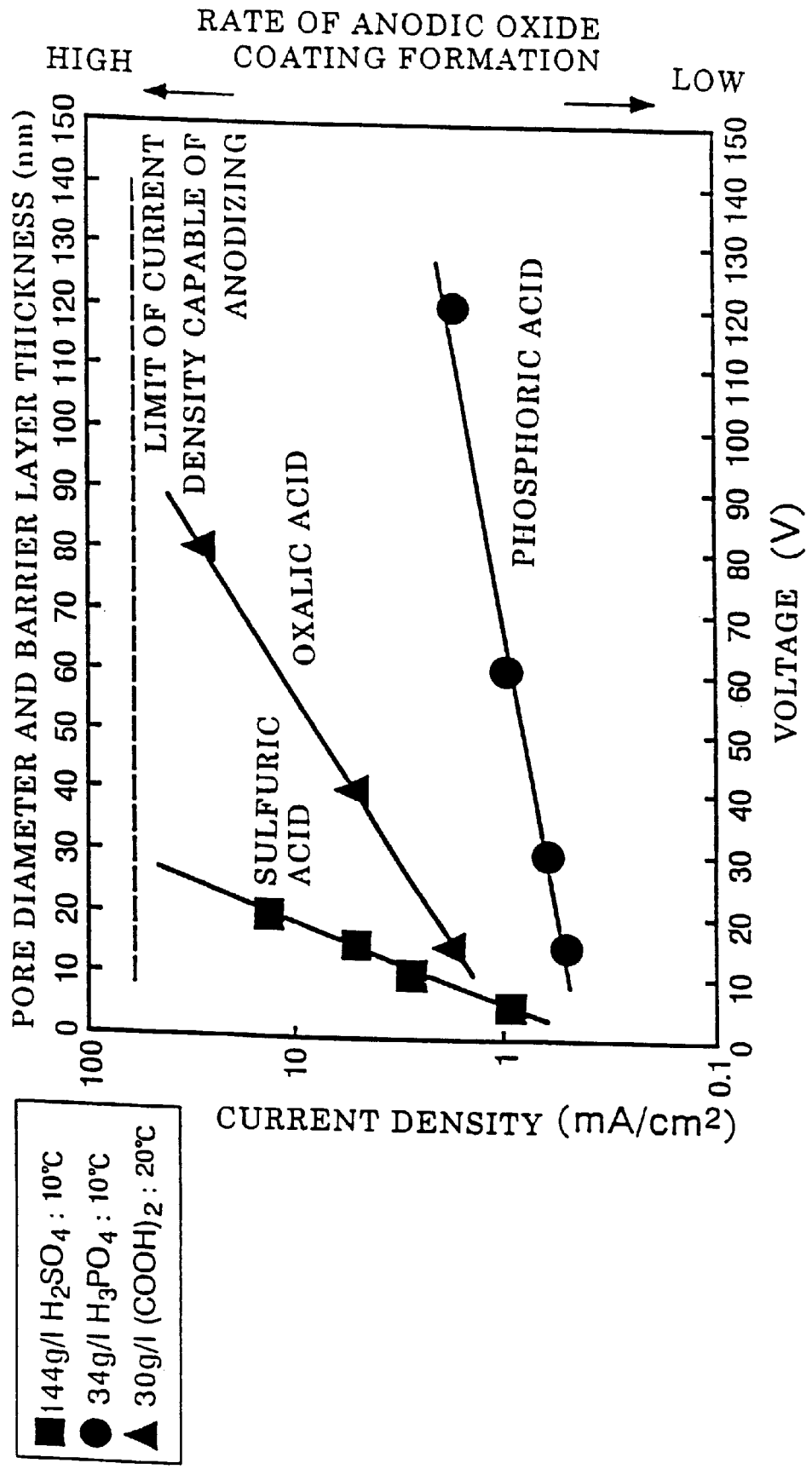
FIG. 3 is a graph illustrating a relationship between an electrolytic voltage and a current density in the case of using three kinds of anodizing solution respectively.

In the present invention, there is no limitation on a kind of solution used for electrolysis. The solution may contain, for example, an inorganic acid such as sulfuric acid, phosphoric acid, chromic acid, or an organic acid such as formic acid and oxalic acid. It is recommended, however, to use solution containing 1 gram or more of oxalic acid per 1 liter of the solution, because the use of such a solution enables the electrolytic voltage in anodizing to be arbitrarily controlled in a broad range. FIG. 3 is a graph illustrating a relationship between the electrolytic voltage and the current density when an anodic oxide coating is formed under various electrolytic conditions using three kinds of anodizing solutions containing sulfuric acid, oxalic acid, and phosphoric acid, respectively. With a sulfuric acid solution, an anodic oxide coating is formed at a high rate, because the current density greatly changes when the electrolytic voltage is changed. With a phosphoric acid solution, an anodic oxide coating is formed at a low rate, because the current density slowly changes even though the electrolytic voltage is greatly changed. From this result, it can be said that when a sulfuric acid solution is used, an anodic oxide coating is formed at too high rate to control the coating thickness. On the other hand, when a phosphoric acid solution is used, an anodic oxide coating is formed at too low rate, resulting in poor production efficiency. Contrary to this, when an oxalic acid solution is used, the change in current density with respect to the electrolytic voltage is in the middle value between that using a sulfuric acid solution and that using a phosphoric acid solution. In addition, when using an oxalic acid solution, the structure of anodic oxide coating can be easily controlled with less deterioration of production efficiency than the case of using a phosphoric acid solution.

As described above, an anodic oxide coating obtains high resistance to gas corrosion and plasma by controlling the structure thereof. The present inventors have conducted further studies, and have found that further improvement in corrosion resistance can be achieved by adjusting a composition of components of anodic oxide coating. More specifically, an anodic oxide coating gains further resistance to gas corrosion and plasma when it contains two or more elements selected from the group consisting of carbon, sulfur, nitrogen, phosphorus, fluorine, and boron (hereinafter, referred to as present elements in some cases.).

When an anodizing solution contains an organic acid such as oxalic acid and formic acid, the produced anodic oxide coating contains a carbon-containing compound such as HCOOH and $(COOH)_2$ (or a compound containing $C_xO_yH_z$ groups such as $—CO_3$, $—C_2O_4$, and $—COOH$, where x, y, and z are integers satisfying the conditions of $x \geq 1$, and y and $z \geq 0$). Accordingly, when an organic acid solution such as oxalic acid solution is used in anodizing, one or more elements other than carbon, selected from the group consisting of sulfur, nitrogen, phosphorus and boron, is added thereto, so that the anodic oxide coating contains two or more elements. Below-described are examples of compounds to be added to the anodizing solution.

(1) In the Case where Sulfur is Added to an Anodizing Solution

An element such as $H_2SO_4$, $Al_2(SO_4)_3$ and the like is added to an anodizing solution, so that the produced anodic oxide coating contains a sulfur-containing compound such as $H_2SO_4$, $H_2SO_3$, $Al_2(SO_4)_3$, $Al(HSO_4)_3$ and the like (or a compound containing $S_xO_yH_z$ groups such as $—SO_4$, $—SO_3$, $—HSO_4$ and the like, where x, y, and z are integers satisfying the conditions of $x \geq 1$, and y and $z > 0$).

(2) In the Case where Nitrogen is Added to an Anodizing Solution

An element such as $HNO_3$, $Al(NO_3)_3$ and the like is added to an anodizing solution, so that the produced anodic oxide coating contains nitrogen-containing compound such as $HNO_3$, $HNO_2$, $Al(NO_3)_3$ and the like (or a compound containing $N_xO_yH_z$ groups such as —$NO_3$, —$NO_2$ and the like, where x, y, and z are integers satisfying the conditions of $x \geq 1$, and y and $z \geq 0$).

(3) In the Case where Phosphorus is Added to an Anodizing Solution

An element such as $H_3PO_4$, $H_3PO_3$, $AlPO_4$ and the like is added to an anodizing solution, so that the produced anodic oxide coating contains phosphorus-containing compound such as $H_3PO_4$, $H_2PHO_3$, $AlPO_4$ and the like (or a compound containing $P_xO_yH_z$ groups such as —$PO_4$, —$HPO_4$, —$H_2PO_4$, —$HPHO_3$ and the like, where x, y, and z are integers satisfying the conditions of $x \geq 1$, and y and $z \geq 0$).

(4) In the Case where Fluorine is Added to an Anodizing Solution

An element such as hydrogen fluoride is added to an anodizing solution, so that the produced anodic oxide coating contains fluorine-containing compound.

(5) In the Case where Boron is Added to an Anodizing Solution

An element such as $(NH_4)_2B_4O_7$, $H_3BO_3$ and the like is added to an anodizing solution, so that the produced anodic oxide coating contains boron-containing compound such as $B_2O_3$, $(NH_4)_2B_4O_7$ and the like (or a compound containing $B_xO_yH_z$ groups such as —$BO_3$, —$B_4O_7$ and the like, where x, y, and z are integers satisfying the conditions of $x \geq 1$, and y and $z \geq 0$).

The compound is added to the anodizing solution in the amount of 0.1 gram or more per 1 liter of the solution upon being converted into the amount of each element, i.e., sulfur, nitrogen, phosphorus, fluorine and boron. With the amount of less than 0.1 gram per 1 liter, it is difficult to achieve remarkable effect.

As already described, when an oxalic acid solution is used as an anodizing solution, the produced anodic oxide coating contains carbon-containing compound derived from the oxalic acid. Therefore, it is enough that one or more present elements other than carbon (i.e., sulfur, nitrogen, phosphorus, fluorine and boron) is added to the anodizing solution. When a sulfuric acid solution is used as an anodizing solution, the produced anodic oxide coating contains sulfur-containing compound derived from the sulfuric acid. Therefore, it is enough that one or more present elements other than sulfur (i.e., carbon, nitrogen, phosphorus, fluorine and boron) is added to the anodizing solution. Depending on the element originally contained in the anodizing solution, a compound containing one or more other present elements is added to the anodizing solution. As a result, the produced anodic oxide coating can contain two or more present elements.

Besides the method in which the above-described compound is added to the anodizing solution, it is possible to employ other methods for allowing two or more present elements to be contained in the anodic oxide coating. For example, it is possible to use the base material made of aluminum alloy containing the present elements as an alloying element. It is also possible to allow the present elements to be contained only in the surface layer of the base material by a surface reforming method such as ion implantation, which is then subjected to anodizing. In any of these methods, the produced anodic oxide coating contains two or more present elements, thereby gaining the enhanced resistance to gas corrosion and plasma.

In order to enhance the resistance to gas corrosion and plasma, the preferable amount (in the unit of weight %) of the present elements to be contained in the anodic oxide coating is as follows. In the case of carbon, the preferable amount is 0.01% or more, and more preferably 0.5% or more. In the case of sulfur, the preferable amount is 0.02% or more, and more preferably 2% or more. In the case of nitrogen, the preferable amount is 0.01% or more, and more preferably 0.7% or more. In the case of phosphorus, the preferable amount is 0.015%, and more preferably 1% or more. In the case of fluorine, the preferable amount is 0.01%, and more preferably 0.5% or more. In the case of boron, the preferable amount is 0.015%, and more preferably 0.3% or more.

In the present invention, an aluminum alloy used for a base material is not limited to a specific kind. However, it is desirable that the vacuum chamber is made of 1000-series alloy, 5000-series alloy, and 6000-series alloy due to their excellent mechanical strength, thermal conductivity, electric conductivity, and corrosion resistance. A 1000-series alloy is a high purity aluminum-series alloy. A 5000-series alloy is desired to contain at least 0.5 or less weight % of silicon and 0.5 to 6.0 weight % of magnesium as alloy contents. A 6000-series alloy is desired to contain at least 0.2 to 1.2 weight % of silicon and 0.4 to 1.5 weight % of magnesium as alloy contents. The components of the chamber may be made of 2000-series alloy and 7000-series alloy besides 5000-series alloy and 6000-series alloy. It is known that the use of aluminum alloy containing magnesium, silicon, copper, iron and the like as alloy contents enhances the resistance to cracks of the anodic oxide coating generated by high frequency and high temperature (heat cycle), and reduces internal force inside the anodic oxide coating. Especially, a 6000-series alloy has a high performance when including magnesium and silicon as alloy contents, and the performance can be further increased by conducting thermal treatment at the final step of the production thereof.

Next, the second invention will be described.

In the second invention, the surface of the base material made of aluminum alloy is anodized under the condition where a final anodizing voltage is higher than an initial anodizing voltage. In this order, an anodic oxide coating is formed with an internal structure which provides excellent resistance to both the gas corrosion and plasma.

In order to suppress the reaction with plasma, the porous layer is required to have a smooth surface with a small pore diameter and a small cell diameter. In the formation of anodic oxide coating, the anodizing proceeds starting from the surface of the base material along the depth direction, and the bottom end structure is dependent on the anodizing voltage. Once the formation of the anodic oxide coating is completed, the pore diameter and the cell diameter thereof never change even by the application of anodizing voltage. As a result, it is preferable that the initial anodizing voltage is set at low level, and specifically, at 50V or less, and more preferably at 30V or less. On the other hand, in order to reduce the internal force inside the anodic oxide coating and to prevent the anodic oxide coating from cracking and peeling off, the bottom end structure of the porous layer is required to have a large pore diameter and large cell diameter. Further, more excellent gas corrosion resistance can be achieved if the anodic oxide coating has a barrier layer with large thickness at the interface between the porous layer and the base material. Taking these points into consideration, a final anodizing voltage is required to be higher than an initial anodizing voltage. It is preferable that the final anodizing voltage is set at 30V or more, and more preferably 50V or more, and the most preferably 70V or more.

When the final anodizing voltage is higher than the initial anodizing voltage, the anodizing voltage may be continuously changed in the entire anodizing process, or may be changed stepwise. Specifically, the anodizing voltage may be continuously or discontinuously changed for an arbitrary period in the anodizing process, or may be kept constant for an arbitrary period in the anodizing process.

As described above, an anodizing voltage is changed for a specific period in the anodizing process so that an anodic oxide coating is formed with a changing internal structure. Thus-formed structure is effective of reducing the internal force and the volumetric change of the anodic oxide coating resulted from the contact with gas or plasma during the use of the vacuum chamber. As a result, it is possible to prevent the anodic oxide coating from cracking or peeling off, which may otherwise cause corrosion and damage, thereby enhancing the resistance to gas and plasma.

FIG. 4 is a diagram illustrating voltage patterns when an electrolytic voltage is continuously changed. As seen in FIG. 4, a voltage level may be gradually increased starting from the initiation of electrolysis, or a voltage level may be increased to a certain level and then decreased, and again increased. FIG. 4 illustrates the patterns when an electrolytic voltage is linearly changed; however, an electrolytic voltage may be curvedly changed.

FIG. 6 is a diagram illustrating patterns when an electrolytic voltage is changed stepwise. As seen in FIG. 6, an electrolytic voltage may be intermittently increased, or may be increased continuously, or may be decreased once and then again increased. When the electrolytic voltage is changed stepwise, it is recommended that the increase and decrease in the voltage values are continuous or small. In this manner, an anodic oxide coating has a structure with continuity in the depth direction, thereby avoiding the formation of portions to which the internal force easily concentrates.

Next, the third invention will be described. The present inventors have found that, in order to form an anodic oxide coating excellent in the resistance to both gas corrosion and plasma, in addition to give a changing structure to the porous-type anodic oxide coating, the porous type anodizing and the non-porous type anodizing are performed to form a barrier layer with a thickness as large as possible.

Figure 8:
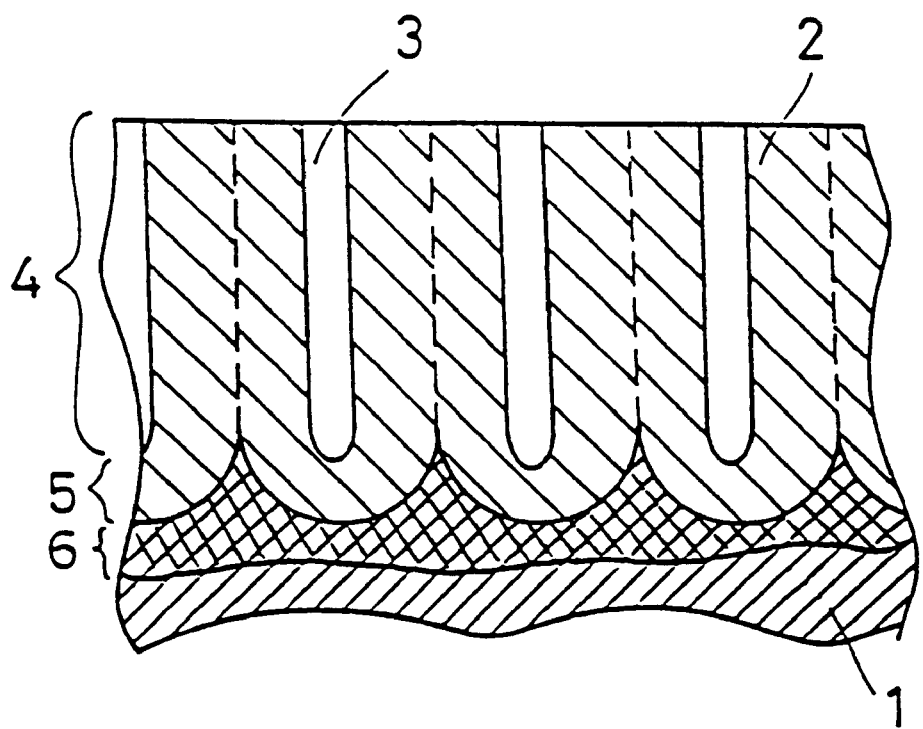
FIG. 8 is a diagram illustrating a structure of an anodic oxide coating formed by the surface treatment method of the present invention.

As shown in FIG. 8, the base material 1 of the vacuum chamber and chamber parts made of aluminum or its alloys is subjected to the porous-type anodizing so as to form the porous layer 4 and the barrier layer 5. Then, the non-porous type anodizing is performed thereto so that the barrier layer 6 grows. As a result, the vacuum chamber or chamber part is excellent in the resistance to both gas corrosion and plasma.

As described above, the porous type anodizing may be conducted using a solution containing any one of sulfuric acid, phosphoric acid, oxalic acid and chromic acid, or a mixture thereof under the electrolytic voltage in the range between 5V and 200V. On the other hand, the non-porous type anodizing for forming a barrier layer with no pores may be conducted using a boric acid-base solution, a phosphoric acid-base solution, a phthalic acid-base solution, an adipic acid-base solution, a carbonic acid-base solution, a citric acid-base solution, a tartaric acid-base solution, and a sodium chromate-base solution, or a mixture thereof under the electrolytic voltage in the range between 60V and 500V.

In the present invention, the porous-type anodizing may be conducted under the electrolytic voltage at a constant value; however, it is recommended that a final anodizing voltage is higher than an initial anodizing voltage so that the pore diameter at the top of porous layer becomes larger than at the bottom thereof. The reason thereof is as follows. In order to achieve excellent plasma resistance, it is preferable that the porous layer has pores with small diameter at the top thereof, while in order to achieve excellent gas corrosion resistance, it is preferable that the porous layer has pores and cells with large diameter at the bottom thereof. More specifically, the initial anodizing voltage is preferably set at 50V or less, and more preferably 30V or less. On the other hand, the final anodizing voltage is preferably higher than the initial anodizing voltage, and the specific value thereof is 30V or more, and more preferably 50V or more, and the most preferably 70V or more.

When the final anodizing voltage is higher than the initial anodizing voltage in porous-type anodizing, the voltage may be continuously changed in the entire anodizing process, or may be changed stepwise. More specifically, the voltage may be continuously or discontinuously changed for an arbitrary period in the entire anodizing process, or may be changed for an arbitrary period while being kept constant for the other arbitrary period.

As described above, in the formation of the porous-type anodic oxide coating, the anodizing voltage is changed for an arbitrary period in the anodizing process so that the produced anodic oxide coating has a changing internal structure. This structure reduces the internal force or the volumetric change of the anodic oxide coating due to the contact with gas or plasma during the use of vacuum chamber. As a result, it is possible to prevent the anodic oxide coating from cracking or peeling off, which may otherwise cause corrosion and damage, thereby enhancing the resistance to gas and plasma.

An anodizing voltage may be continuously changed. In this case, for example, the voltage may be gradually increased starting from the initiation of electrolysis, or may be increased to a certain level and then decreased, and reincreased. FIG. 6 is a diagram showing voltage patterns when the electrolytic voltage is changed stepwise. As shown in FIG. 6, there are several methods for changing the electrolytic voltage. Patterns A and C show the case where the electrolytic voltage is intermittently increased. Patterns B and C show the case where the increase in the voltage level is continuous. Patterns E and F show the case where the electrolytic voltage is increased and then decreased, and reincreased. When an electrolytic voltage is changed stepwise, it is recommended that the increase and decrease in the voltage are continuous or small. In this manner, the anodic oxide coating is provided with a structure having continuity in the depth direction, thereby avoiding the formation of portions to which the internal force is easily concentrated.

In the present invention, a pore diameter of the porous-type anodic oxide coating is not limited to a specific value; however, a pore diameter at the bottom is larger than that at the top. With this structure, the corrosion resistance is enhanced. In order to achieve excellent plasma resistance, it is preferable that a pore diameter at the top is 80 nm or less, and more preferably 50 nm or less, and the most preferably 30 nm or less.

In the present invention, the thickness of the porous layer is not limited to a specific value; however, in order to achieve excellent corrosion resistance, it is preferable that the thickness of the porous layer is 0.05 $\mu$m or more, and more preferably 0.1 $\mu$m or more. The desirable maximum thickness is 50 $\mu$m, because if the thickness is too large, the porous layer may have cracks due to the internal force. This may cause problems such as insufficient coating performance or peeling of the anodic oxide coating. More specifically, if the porous layer has a thickness of larger than 50 $\mu$m, it may be difficult for the anodic oxide coating to reduce its internal force by itself. In this case, the anodic oxide coating may have cracks and peel off, causing a problem of producing defective products.

Further, in order to achieve excellent gas corrosion resistance, it is preferable that the barrier layer has a thickness of 50 nm or more, and more preferably 80 nm or more.

Next, the fourth invention will be described.

Even though the above-described surface treatment is conducted in the formation of anodic oxide coating, it is impossible to completely avoid the penetration of corrosive elements into a base material. During the use of a vacuum chamber or chamber part, corrosive elements passes, though very slowly, through an anodic oxide coating and penetrate into a base material made of aluminum alloy. Therefore, in addition to the improvement of surface treatment technique, it is also important to enhance the corrosion resistance of material itself used for a vacuum chamber and chamber parts.

Depending on desired physical properties, an aluminum alloy is provided with several kinds of alloying elements, and at least iron and silicon are always contained as inevitable impurities. A 1000-series alloy, which is not positively provided with alloying elements, also may contain a certain amount of iron and silicon as inevitable impurities. Accordingly, when using a 1000-series aluminum alloy, the base material contains at least 1000-type precipitates which have been already described. Duralumin made of 2000-series alloy has the high strength resulted from the dispersion curing effect of deposits. Accordingly, a vacuum chamber made of aluminum alloy contains precipitates such as precipitates or deposits containing inevitable impurities, alloying elements and the like.

However, the presence of the precipitates and/or deposits seriously impairs the corrosion resistance, and therefore, is not desirable. More specifically, halogen elements such as chlorine, fluorine and bromine have high corrosivity and penetrate into a base material made of aluminum, causing corrosion of the base material. When a base material contains precipitates and/or deposits, halogen elements are likely to penetrate into the interface between the precipitates and/or deposits and the base material made of aluminum. In order to ensure corrosion resistance, it is desirable that a base material contains precipitates and/or deposits in an amount as small as possible. However, in order to reduce the content of inevitable impurities such as iron and silicon to the level as low as possible, it is necessary to prepare an aluminum alloy having extremely high purity. This requires high cost and thus is not practical.

The present inventors have conducted studies to enhance the corrosion resistance of base material made of aluminum alloy on the assumption that precipitates and/or deposits are present therein. As a result, it has been found that when precipitates and/or deposits are present in a minute and uniform state, or are arranged in parallel with the largest area of the base material, the base material is excellent in corrosion resistance. More specifically, the precipitates and/or deposits are arranged not to be present continuously with respect to the direction along which the corrosive elements penetrate. With this arrangement, the base material has the high resistance to both gas corrosion and plasma.

In order to achieve excellent resistance to corrosion, it is effective that the precipitates and/or deposits have a diameter of 10 $\mu$m in average. With a small diameter, precipitates and/or deposits lose continuity and easily keep adequate spaces each other. As a result, the corrosion resistance is enhanced. The preferable average diameter of precipitates is 6 $\mu$m or less, and more preferably 3 $\mu$m or less. The preferable average diameter of deposits is 2 $\mu$m or less in average, and more preferably 1 $\mu$m or less. In this case, if some particles have too large diameter even though the average diameter falls within these ranges, the corrosion resistance may be adversely affected. Accordingly, the maximum diameter of the precipitates and/or deposits is preferably 15 $\mu$m or less, and more preferably 10 $\mu$m or less.

In some environment where a vacuum chamber or chamber part is used, deposits may grow and gain their diameters during use. In spite of such a situation, the maximum diameter thereof preferably falls within the above-described ranges. However, in the case where a vacuum chamber is used in the environment that does not allow the particle diameter to stay within these ranges, it is desirable to select a base material having deposits with a diameter as small as possible (specifically, a base material having deposits with an average diameter of 2 $\mu$m or less, and more preferably 1 $\mu$m or less).

In order to disperse precipitates and/or deposits in a minute form in an aluminum alloy, a content of alloying element and inevitable impurities in an alloy composition is reduced to the level as low as possible. Besides this method, there is also a method in which a casting rate is controlled. More specifically, in casting, a cooling rate is increased to the level as high as possible, thereby controlling the average diameter and the volumetric proportion of the precipitates and deposits to small values. The cooling rate in casting is preferably 1° C./sec or more, and more preferably 10° C./sec or more.

The particle diameter, the shape, and the distribution state of the deposits can be controlled by performing thermal treatment at the final step of producing the base material (for example, T4, T6). Specifically, the liquefaction is performed at a temperature as high as possible (for example, the temperature is increased to the level immediately before the solidification is started.) so as to form a supersaturated solid solution, and after that, multistage aging treatment such as a double stage treatment and a triple stage treatment is performed. As described above, even after the casting, the diameter of deposits can be further decreased by performing the above-described thermal treatment.

Moreover, in hot extrusion or hot rolling performed after the casting, the precipitates and/or deposits are likely to be arranged along the directions of extrusion and rolling. Even when the aluminum alloy containing the precipitates and/or deposits arranged along a specific direction is used for the base material, depending on the shape of each vacuum chamber, the largest area of the base material is made to be parallel with the arrangement direction thereof, thereby enhancing the corrosion resistance.

Figure 9:
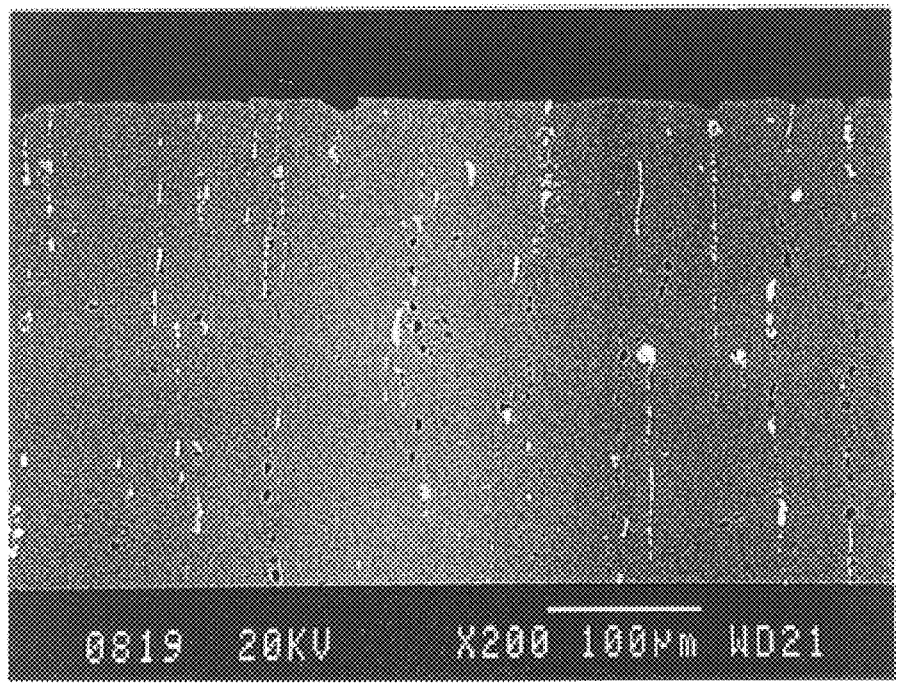
FIG. 9 is a micrograph showing precipitates and/or deposits arranged in a direction perpendicular to the surface of the base material.
Figure 10:
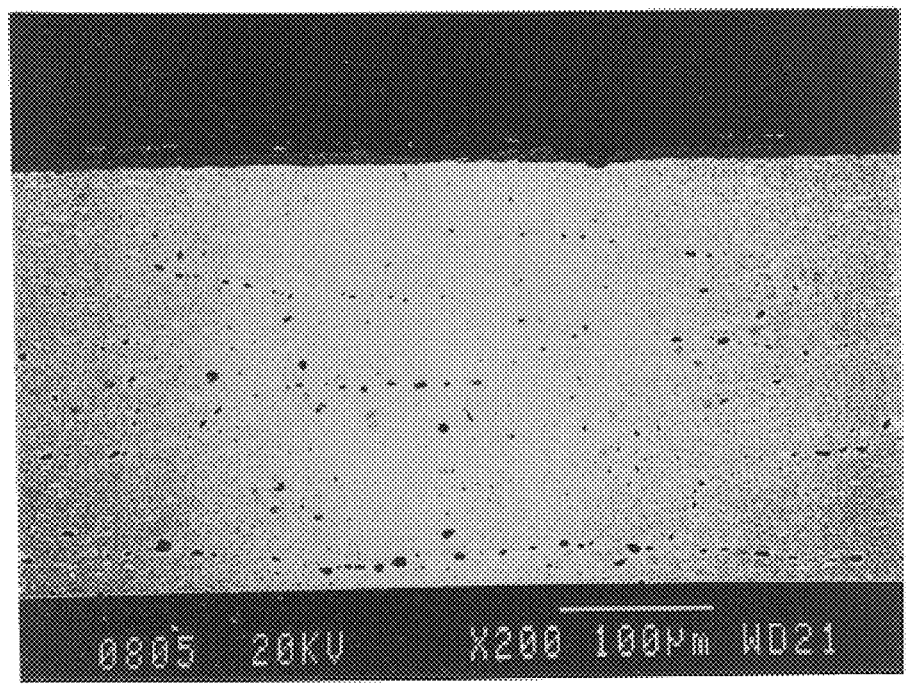
FIG. 10 is a micrograph showing precipitates and/or deposits arranged in a direction parallel to the surface of the base material.

FIG. 9 and FIG. 10 are micrographs showing precipitates and/or deposits viewed from the cross-section of the vacuum chamber. White-colored portions are precipitates and black-colored portions are deposits. In both FIG. 9 and FIG. 10, the upper side is the surface of the vacuum chamber where an anodic oxide coating is formed. In FIG. 9, the precipitates and/or the deposits are arranged in perpendicular to the surface of the vacuum chamber. In FIG. 10, the precipitates and/or deposits are arranged in parallel with the surface of the vacuum chamber. In FIG. 9, there are some precipitates and/or deposits having a diameter of more than 15 $\mu$m, while in FIG. 10, all the precipitates and/or deposits have a diameter of 10 $\mu$m or less. Accordingly, FIG. 10 illustrates a vacuum chamber with a base material having precipitates and/or deposits with a diameter of 10 $\mu$m or less, and the precipitates and/or deposits are arranged in parallel with the largest surface of the base material.

Some kinds of vacuum chamber or chamber part may contain, due to the restriction from their shapes, precipitates and/or deposits arranged in perpendicular with the largest area of the base material. Examples of such vacuum chambers include susceptors, gas diffusion plates, dielectric plates such as electrostatic chucks, all of which have a disk-shaped base material. For example, in many cases, susceptors are produced in a disk-like shape by cutting a column-like extruded material into round slices. Thus-produced susceptors contain precipitates and/or deposits arranged along a direction of hot extrusion, and this arrangement direction may be in perpendicular to the surface and bottom of susceptor. Accordingly, when a vacuum chamber is a susceptor like this, the corrosion resistance is enhanced by controlling the average diameter of precipitates and/or deposits to be as small as possible, instead of controlling the arrangement direction thereof.

Moreover, the corrosion resistance can be further enhanced by, besides controlling the average diameter and/or the arrangement of precipitates and/or deposits, controlling the volumetric proportion thereof to be as small as possible. More specifically, the volumetric proportion of the precipitates and/or deposits is preferably 4% or less, and more preferably 2% or less, and the most preferably 1% or less.

A preferable combination of the average diameter and the volumetric proportion of the precipitates and/or deposits is as follows. As to the precipitates, it is preferable that the average diameter is 6 $\mu$m or less and the volumetric proportion is 4% or less (desirably 2% or less), and more preferably, the average diameter is 3 $\mu$m or less and the volumetric proportion is 2% or less (desirably 1% or less). As to the deposits, it is preferable that the average diameter is 2 $\mu$m or less and the volumetric proportion is 4% or less (desirably 2% or less), and more preferably the average diameter is 1 $\mu$m or less and the volumetric proportion is 2% or less (desirably 1% or less).

In some methods and conditions for producing an aluminum alloy, it is possible to control the diameter and the volumetric proportion of the precipitates and/or deposits present on the surface of the aluminum alloy. For example, there is a method in which, when solidified, the surface of an aluminum alloy is rapidly cooled to control the formation of the precipitates and/or deposits. In this case, a pressure may be applied so that precipitation and deposition are promoted in the bulk middle portion of the aluminum alloy. There is also a method in which an aluminum alloy excellent in corrosion resistance is cladded on the surface of the vacuum chamber.

In the above-described methods, control is conducted in such a manner that at least the largest area of the base material from the surface up to 1 mm deep contains precipitates having an average diameter of 3 $\mu$m or less and a volumetric proportion of 1% or less and deposits having an average diameter of 1 $\mu$m or less and a volumetric proportion of 1% or less. Consequently, the surface of the base material gains further resistance to gas corrosion and plasma, resulting in further enhancing the corrosion resistance of the entire vacuum chamber.

When a vacuum chamber is produced by using the material of the present invention, the corrosion resistance and the abrasion resistance can be further enhanced by forming a coating on the surface thereof employing a known surface treatment other than the anodizing. Examples of such surface treatments include a physical vapor deposition such as sputtering and ion-plating, chemical vapor deposition, and thermal spraying.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

EXAMPLE 1

As shown in Table 1, various aluminum alloy plates were provided with an anodic oxide coating having different structure from each other. These aluminum alloy plates were used as test pieces. Each anodic oxide coating included a porous layer having pores with a diameter continuously changing in a depth direction. Table 1 also shows the number of layers included in each porous layer, a pore diameter at a top and a bottom of each porous layer, an electrolytic solution used for anodizing, and the thickness of each anodic oxide coating.

In order to evaluate the corrosion resistance to a halogen-containing gas for the test pieces, a gas corrosion test was conducted by using 5% of mixed gas of $Cl_2$ and Ar at a temperature of 300° C. for 4 hours. Upon completion of the test, the appearance of test pieces was evaluated under the following standards.

<Gas Corrosion Test>

○: No corrosion was generated.

Δ: Corrosion was generated in an area of less than 5% of test piece.

x: Corrosion was generated in an area of 5% or more of test piece.

In addition, in order to evaluate the resistance to plasma for the test pieces, a chlorine plasma irradiation test was conducted under the low bias for 90 minutes. Upon completion of the test, the etched depth of the test pieces was measured and evaluated under the following standards.

<Plasma Irradiation Test>

○: Test piece was etched in a depth of less than 2 $\mu$m.

Δ: Test piece was etched in a depth in the range between 2 $\mu$m or more and less than 5 $\mu$m.

x: Test piece was etched in a depth of 5 $\mu$m or more.

The results of the gas corrosion test and the plasma irradiation test are shown in Table 1.

TABLE 1

| No. | | Kind of-Al alloy | Structure* of porous layer | Treatment method | Thickness of anodic oxide coating ($\mu$m) | Gas Corrosion test | Plasma irradiation test |
| --- | --- | --- | --- | --- | --- | --- | --- |
| Example of present invention | 1 | 1000-series | a | anodizing | 2 | ○ | ○ |
| | 2 | 6000-series | b | | 35 | ○ | ○ |
| | 3 | | c | | 25 | ○ | ○ |

TABLE 1-continued

| No. | | Kind of-Al alloy | Structure* of porous layer | Treatment method | Thickness of anodic oxide coating (μm) | Gas Corrosion test | Plasma irradiation test |
|---|---|---|---|---|---|---|---|
| | 4 | 5000-series | d | | 0.8 | ○ | ○ |
| | 5 | | e | | 15 | ○ | ○ |
| Comparative example | 6 | | f | | 0.04 | x | x |
| | 7 | 6000-series | g | | 45 | x | Δ |
| | 8 | | h | | 70 | x | ○ |
| | 9 | | — | — | — | x | x |

*Remarks: Structure of porous layer is indicated by means of pore diameter
- a: top: 10~200 nm: base (phosphoric acid)
- b: top: 15~20 nm: base (sulfuric acid-oxalic acid)
- c: top: 12 ~55~30~120 nm: base (phosphoric acid)
- d: top: 8~250 nm: bottom (phosphoric acid)
- e: top: 25~35 nm: bottom (sulfuric acid-oxalic acid)
- f: top: 20~20 nm: bottom (phosphoric acid)
- g: top: 15~15 nm: bottom (sulfuric acid)
- h: top: 5~10 nm: bottom (sulfuric acid)

As is obvious from the results shown in Table 1, the test pieces Nos. 1 to 5, satisfying the conditions of the present invention, exhibited the excellent resistance to gas corrosion and plasma. On the other hand, the test pieces Nos. 6 to 9, corresponding to the comparative examples and not satisfying one or more conditions of the present invention, exhibited the insufficient resistance to gas corrosion and/or plasma.

EXAMPLE 2

As shown in Table 2, various aluminum alloy plates were provided with an anodic oxide coating having different structure from each other. In Example 2, an oxalic acid solution was used as an electrolytic solution. These aluminum alloy plates were used as test pieces. Each anodic oxide coating included a porous layer having pores with a diameter continuously changing in a depth direction. Table 2 also shows the number of layers included in each porous layer, a pore diameter at a top and a bottom of each porous layer, and the thickness of each anodic oxide coating.

Repeating the gas corrosion test and the plasma irradiation test conducted in Example 1, the test pieces were tested to evaluate their resistance to gas corrosion and plasma. The test results are as shown in Table 2.

*Remarks: Structure of porous layer is indicated by means of pore diameter
- a: top: 15~140 nm: bottom
- b: top: 20~150 nm: bottom
- c: top: 20~50~30~150 nm: bottom
- d: top: 10~180 nm: bottom
- e: top: 10~20~10~70 nm: bottom
- f: top: 10~45 nm: bottom
- g: top: 20~20 nm: bottom
- h: top: 5~40 nm: bottom As is obvious from the results shown in Table 2, the test pieces Nos. 1 to 5, satisfying the conditions of the present invention, exhibited the excellent resistance to gas corrosion and plasma. On the other hand, the test pieces Nos. 6 to 9, corresponding to the comparative examples and not satisfying one or more conditions of the present invention, exhibited the insufficient resistance to gas corrosion and/or plasma.

EXAMPLE 3

As shown in Table 3, various aluminum alloy plates were provided with an anodic oxide coating having different structure from each other. These aluminum alloy plates were used as test pieces. A porous layer including two or more layers had pores with a diameter which changed stepwise. However, the test piece No. 4 had an intermediate layer of which pore diameter continuously changed, thereby pores have tapered surfaces. Table 3 also shows kinds of electrolytic solutions used in anodizing and the thickness of each anodic oxide coating.

Repeating the gas corrosion test and the plasma irradiation test conducted in Example 1, the test pieces were tested to evaluate their resistance to gas corrosion and plasma. The test results are shown in Table 3.

TABLE 2

| No. | | Kind of-Al alloy | Structure* of porous layer | Treatment method | Thickness of anodic oxide coating (μm) | Gas corrosion test | Plasma irradiation test |
|---|---|---|---|---|---|---|---|
| Example of present invention | 1 | 5000-series | a | oxalic acid anodizing | 15 | ○ | ○ |
| | 2 | | b | | 0.1 | ○ | ○ |
| | 3 | 1000-series | c | | 5 | ○ | ○ |
| | 4 | 6000-series | d | | 35 | ○ | ○ |
| | 5 | | e | | 15 | ○ | ○ |
| Comparative example | 6 | | f | | 0.03 | x | x |
| | 7 | | g | | 40 | x | Δ |
| | 8 | 1000-series | h | | 60 | x | ○ |
| | 9 | 5000-series | — | — | — | x | x |

TABLE 3

| No. | | Kind of Al alloy | Structure of porous layer | | Treatment method | Thickness of anodic oxide coating (μm) | Gas corrosion test | Plasma irradiation test |
|---|---|---|---|---|---|---|---|---|
| | | | Number of layers | Pore diameter (nm)* top/bottom | | | | |
| Example of present invention | 1 | 1000-series | 2 | 20(P)/100(P) | anodizing | 4 | ○ | ○ |
| | 2 | | 3 | 50(P)/30(S)/70(P) | | 0.5 | ○ | ○ |
| | 3 | 6000-series | 2 | 10(S-O)/120(P) | | 5 | ○ | ○ |
| | 4 | | 2 | 15(S)/tapered layer (P)/130(P) | | 30 | ○ | ○ |
| | 5 | | 3 | 15(S)/40(P)/150(P) | | 30 | ○ | ○ |
| | 6 | | 5 | 30(P)/50(P)/80(P)/200(P) | | 45 | ○ | ○ |
| | 7 | 5000-series | 6 | 20(S)/120(P)/20(S)/120(P)/20(S)/180(P) | | 10 | ○ | ○ |
| | 8 | | 2 | 80(P)/250(P) | | 0.2 | ○ | ○ |
| Comparative example | 9 | | 1 | 10(S) | | 30 | Δ | Δ |
| | 10 | 6000-series | — | — | — | — | x | x |
| | 11 | 1000-series | 2 | 10(S)/50(P) | anodizing | 0.03 | x | x |
| | 12 | | 2 | 80(P)/15(S) | | 70 | x | Δ |

*Remarks:
(P): phosphoric acid anodizing
(S): sulfuric acid anodizing
(S-O): sulfuric acid-oxalic acid anodizing As is obvious from the results shown in Table 3, the test pieces Nos. 1 to 8, satisfying the conditions of the present invention, exhibited the excellent resistance to gas corrosion and plasma. On the other hand, the test pieces Nos. 9 to 12, corresponding to the comparative examples and not satis- Table 4 also shows the structure of each porous layer and the thickness of each anodic oxide coating.

The test pieces were tested to evaluate their resistance to gas corrosion and plasma repeating the gas corrosion test and the plasma irradiation test conducted in Example 1, except that the gas corrosion test was conduted at 300° C. for 4 hours and the chlorine plasma irradiation test was conducted for 120 minutes. The test results are shown in Table 4.

TABLE 4

| No. | | Kind of Al alloy | Structure of porous layer | | Treatment method | Thickness of anodic oxide coating (μm) | Gas corrosion test | Plasma irradiation test |
|---|---|---|---|---|---|---|---|---|
| | | | Number of layers | Pore diameter (nm) top/bottom | | | | |
| Example of present invention | 1 | 5000-series | 2 | 10/80 | oxalic acid anodizing | 15 | ○ | ○ |
| | 2 | | 2 | 15/tapered layer/110 | | 35 | ○ | ○ |
| | 3 | | 3 | 20/30/150 | | 0.8 | ○ | ○ |
| | 4 | | 4 | 15/120/30/150 | | 30 | ○ | ○ |
| | 5 | 1000-series | 3 | 15/40/150 | | 20 | ○ | ○ |
| | 6 | | 2 | 40/80 | | 4 | ○ | ○ |
| | 7 | 6000-series | 2 | 10/150 | | 35 | ○ | ○ |
| | 8 | | 2 | 20/tapered layer/125 | | 30 | ○ | ○ |
| | 9 | | 3 | 15/80/150 | | 25 | ○ | ○ |
| Comparative example | 10 | | 1 | 15 | | 10 | x | ○ |
| | 11 | | 2 | 10/220 | | 0.03 | Δ | x |
| | 12 | 1000-series | 1 | 20/50 | | 60 | x | Δ |
| | 13 | 5000-series | 3 | 10/50/100 | | 60 | Δ | Δ |
| | 14 | | — | — | — | — | x | x | fying one or more conditions of the present invention, exhibited the insufficient resistance to gas corrosion and/or plasma.

EXAMPLE 4

As shown in Table 4, various aluminum alloy plates were provided with an anodic oxide coating having different structure from each other. In Example 4, an oxalic acid solution was used as an electrolytic solution. These aluminum alloy plates were used as test pieces. A porous layer including two or more layers had pores with a diameter which changed stepwise. However, the test pieces Nos. 2 and 8 had an intermediate layer of which pore diameter continuously changed, thereby pores have tapered surfaces.

As is obvious from the results shown in Table 4, the test pieces Nos. 1 to 9, satisfying the conditions of the present invention, exhibited the excellent resistance to gas corrosion and plasma. On the other hand, the test pieces Nos. 10 to 14, corresponding to the comparative examples and not satisfying one or more conditions of the present invention, exhibited the insufficient resistance to gas corrosion and/or plasma.

EXAMPLE 5

As shown in Table 5, various aluminum alloy plates were provided with an anodic oxide coating having different structure form each other. These aluminum alloy plates were used as test pieces. Table 5 also shows the change in the structure of each porous layer by means of a pore diameter, kinds of electrolytic solutions used in anodizing, and the thickness of each anodic oxide coating.

Repeating the gas corrosion test and the plasma irradiation test conducted in Example 1, the test pieces were tested to evaluate their resistance to gas corrosion and plasma. The test results are shown in Table 5.

TABLE 5

| No. | | Kind of Al alloy | Structure of porous layer | | Treatment method | Thickness of anodic oxide coating (μm) | Gas corrosion test | Plasma irradiation test |
|---|---|---|---|---|---|---|---|---|
| | | | Numbers of layer | Pore diameter | | | | |
| Example of present invention | 1 | 5000-series | 2 | a | anodizing | 15 | ○ | ○ |
| | 2 | | 3 | b | | 0.08 | ○ | ○ |
| | 3 | 6000-series | 2 | c | | 35 | ○ | ○ |
| | 4 | | 4 | d | | 2 | ○ | ○ |
| | 5 | | 5 | e | | 45 | ○ | ○ |
| Comparative example | 6 | | 2 | f | | 60 | Δ | ○ |
| | 7 | 5000-series | 1 | g | | 0.02 | x | x |
| | 8 | | — | — | — | — | x | x |

*Remarks: Pore diameter of each layer
- a: top: 10~25 nm (sulfuric acid)/50~120 nm (phosphoric acid): bottom
- b: top: 20~25 nm (sulfuric acid-oxalic acid)/30~50 nm (sulfuric acid-oxalic acid)/30~120 nm (phosphoric acid): bottom
- c: top: 15~50 nm (phosphoric acid)/60~250 nm (phosphoric acid): bottom
- d: top: 20~25 nm (sulfuric acid-oxalic acid/30~120 nm (phosphoric acid)/100~120 nm (phosphoric acid)/100~250 nm (phosphoric acid): bottom
- e: top: 10~15 nm (sulfuric acid)/30~40 nm (sulfuric acid-oxalic acid)/100~120 nm (phosphoric acid)/80~100 nm (phosphoric acid)/80~250 nm (phosphoric acid): bottom
- f: top: 10 nm (sulfuric acid)/20 nm (sulfuric acid-oxalic acid): bottom
- g: top: 20 nm (sulfuric acid): bottom The anodic oxide coating of the test pieces Nos. 1 to 5 had a porous layer including two or more layers and having pores with a diameter which changed continuously. As is obvious from the results shown in Table 5, the test pieces Nos. 1 to 5, satisfying the conditions of the present invention, exhibited the excellent resistance to gas corrosion and plasma. On the other hand, the test pieces Nos. 6 to 8, corresponding to the comparative examples and not satisfying one or more conditions of the present invention, exhibited the insufficient resistance to gas corrosion and/or plasma.

EXAMPLE 6

As shown in Table 6, various aluminum alloy plates were provided with an anodic oxide coating having different structure from each other. In Example 6, an oxalic acid solution was used as an electrolytic solution. These aluminum alloy plates were used as test pieces. Table 6 also shows the change in structure of each porous layer by means of a pore diameter and the thickness of each anodic oxide coating.

Repeating the gas corrosion test and the plasma irradiation test conducted in Example 4, the test pieces were tested to evaluate their resistance to gas corrosion and plasma. The test results are shown in Table 6.

TABLE 6

| No. | | Kind of Al alloy | Structure of porous layer | | Treatment method | Thickness of anodic oxide coating (μm) | Gas corrosion test | Plasma irradiation test |
|---|---|---|---|---|---|---|---|---|
| | | | Numbers of layer | Pore diameter | | | | |
| Example of present invention | 1 | 5000-series | 2 | a | oxalic acid anodizing | 30 | ○ | ○ |
| | 2 | | 2 | b | | 0.2 | ○ | ○ |
| | 3 | | 3 | c | | 5 | ○ | ○ |
| | 4 | 6000-series | 2 | d | | 35 | ○ | ○ |
| | 5 | | 5 | e | | 0.8 | ○ | ○ |
| Comparative example | 6 | | 2 | f | | 60 | Δ | ○ |
| | 7 | 1000-series | 1 | g | | 0.03 | x | x |
| | 8 | 5000-series | 1 | h | | 2 | x | Δ |
| | 9 | | — | — | — | — | x | x |

*Remarks: pore diameter of each layer
- a: top: 10~20 nm/30~200 nm: bottom
- b: top: 20~25 nm/80~160 nm: bottom
- c: top: 15~15 nm/50~100 nm/80~160 nm: bottom
- d: top: 20~25 nm/100~250 nm: bottom
- e: top: 10~15 nm/30~50 nm/80~120 nm/80~120 nm/80~250 nm: bottom
- f: top: 10 nm/20 nm: bottom
- g: top: 20 nm: bottom
- h: top: 10 nm: bottom The test pieces Nos. 1 to 5 had a porous layer including two or more layers having pores with a diameter which changed continuously. As is obvious from the results shown in Table 6, the test pieces Nos. 1 to 5, satisfying the conditions of the present invention, exhibited the excellent resistance to gas corrosion and plasma. On the other hand, test pieces Nos. 6 to 9, corresponding to the comparative examples and not satisfying one or more conditions of the present invention, exhibited the insufficient resistance to gas corrosion and/or plasma.

EXAMPLE 7

As shown in Table 7, various aluminum alloy plates were provided with an anodic oxide coating having different structure from each other. These aluminum alloy plates were used as test pieces. Table 7 also shows the number of layers included in each porous layer, a pore diameter at a top and a bottom of each porous layer, kinds of electrolytic solutions used for anodizing, and the thickness of each anodic oxide coating.

In order to evaluate the corrosion resistance to a halogen-containing gas for the test pieces, a gas corrosion test was conducted by using 10% of mixed gas of $Cl_2$ and Ar at a temperature of 350° C. for 4 hours. Upon the completion of the test, the appearance of test pieces was evaluated under the following standards.

<Gas Corrosion Test>

⊚: No corrosion was generated.

○: Corrosion was generated in an area of less than 5% of test piece.

Δ: Corrosion was generated in an area in the range between 5% or more and less than 10% of test piece.

x: Corrosion was generated in an area of 10% or more of test piece.

In addition, in order to evaluate the resistance to plasma for the test pieces, a chlorine plasma irradiation test was conducted under the low bias for 120 minutes. Upon completion of the test, the etched depth of the test pieces was measured and evaluated under the following standards.

<Plasma Irradiation Test>

⊚: Test piece was etched in a depth of less than 1.5 μm.

○: Test piece was etched in a depth in the range between 1.5 μm or more and less than 2 μm.

Δ: Test piece was etched in a depth in the range between 2 μm or more and less than 5 μm.

x: Test piece was etched in a depth of 5 μm or more.

The results of gas corrosion test and the plasma irradiation test are shown in Table 7.

TABLE 7

| | | Kind of Al alloy | Number of layers | Structure of porous layer Pore diameter (nm) top/bottom | Originally contained compound + added compound Mark "/" indicates that each layer contains different compound | Components contained in coating | Treatment method | Thickness of anodic oxide coating (μm) | Gas corrosion test | Plasma irradiation test |
|---|---|---|---|---|---|---|---|---|---|---|
| Example of present invention | 1 | 1000-series | 2 | 20/100 | $H_3PO_4$/(COOH)$_2$ | 4% P/0.015% C | anodizing | 4 | ○ | ○ |
| | 2 | | 2 | 20/100 | $H_3PO_4$ + HF/ (COOH)$_2$ + HF | 4% P + 0.02% F/ 2% C + 0.02% F | | 3 | ⊚ | ○ |
| | 3 | | 3 | 50/30/70 | (COOH)$_2$ + $Al_2(SO_4)_2$ | 2% C + 0.03% S | | 0.1 | ⊚ | ○ |
| | 4 | 6000-series | 2 | 10/120 | $H_2SO_4$ + $H_3PO_3$/ (COOH)$_2$ + $H_3PO_3$ | 4% S + 0.02 P %/ 1.8% C + 0.02% P | | 3 | ⊚ | ○ |
| | 5 | | 3 | 15/40/150 | $H_3PO_4$ + $Al(NO_3)_3$ | 3% P + 0.025% N | | 30 | ⊚ | ⊚ |
| | 6 | | 5 | 30/50/80/200 | $H_3PO_4$ + (COOH)$_2$ | 4% P + 0.03% C | | 1.5 | ⊚ | ○ |
| | 7 | 5000-series | 6 | 20/120/20/ 120/20/180 | (COOH)$_2$ + $H_2SO_4$ | 2% C + 0.2% S | | 35 | ○ | ⊚ |
| | 8 | | 6 | 20/120/20 120/20/180 | (COOH)$_2$ + $HNO_3$ | 2% C + 0.04% N | | 5 | ⊚ | ⊚ |
| | 9 | | 2 | 5/10 | $H_2SO_4$ + $H_3BO_3$ | 3% S + 0.025% B | | 0.2 | ⊚ | ○ |
| Comparative example | 10 | | 1 | 5 | (COOH)$_2$ | 2% C | | 30 | Δ | Δ |
| | 11 | 6000-series | — | — | — | — | — | — | X | X |
| | 12 | 1000-series | 2 | 10/50 | $H_3PO_4$ | 3% P | anodizing | 0.03 | X | X |
| | 13 | | 2 | 80/15 | $H_3PO_4$ + $H_2SO_4$ | 3% P + 0.1% S | | 70 | Δ | Δ |

As is obvious from the results shown in Table 7, the test pieces Nos. 1 to 9, satisfying the conditions of the present invention, exhibited the excellent resistance to gas corrosion and plasma. On the other hand, the test pieces Nos. 10 to 13, corresponding to the comparative examples and not satisfying one or more conditions of the present invention, exhibited the insufficient resistance to gas corrosion and/or plasma.

EXAMPLE 8

As shown in Table 8, various aluminum alloy plates were provided with an anodic oxide coating having different structure from each other. These aluminum alloy plates were used as test pieces. Table 8 also shows the change in the structure of each porous layer by means of a pore diameter, kinds of electrolytic solutions used in anodizing, and the thickness of each anodic oxide coating.

The test pieces were tested to evaluate their resistance to gas corrosion and plasma repeating the gas corrosion test and the plasma irradiation test conducted in Example 7, except that the gas corrosion test was conducted at 350° C. for 5 hours and the chlorine plasma irradiation test was conducted for 150 minutes. The test results are shown in Table 8.

TABLE 8

| No. | | Kind of Al alloy | Structure* of coating | Originally contained compound + added compound | Components contained in coating | Treatment method | Thickness of anodic oxide coating (μm) | Gas corrosion test | Plasma irradiation test |
|---|---|---|---|---|---|---|---|---|---|
| Example of present invention | 1 | 1000-series | a | (COOH)$_2$ + H$_3$PO$_4$ | 1.5% C + 0.03% P | anodizing | 2.8 | ⊚ | ○ |
| | 2 | 6000-series | b | H$_3$PO$_4$ + HF | 3% P + 0.02% F | | 10 | ○ | ○ |
| | 3 | | b | H$_3$PO$_4$ + H$_2$SO$_4$ | 3% P + 0.04% S | | 8 | ⊚ | ⊚ |
| | 4 | | c | H$_2$SO$_4$ + HNO$_3$ | 4% S + 0.5% N | | 38 | ⊚ | ⊚ |
| | 5 | 5000-series | d | (COOH)$_2$ + H$_3$BO$_3$ | 1.5% C + 0.03% B | | 0.07 | ○ | ○ |
| | 6 | | d | (COOH)$_2$ + HF | 1.5% C + 0.02% F | | 0.06 | ⊚ | ○ |
| | 7 | | e | H$_3$PO$_4$ + H$_2$CO$_3$ | 3% P + 0.04% C | | 20 | ⊚ | ⊚ |
| Comparative example | 8 | | f | H$_3$PO$_4$ | 3% P | | 0.03 | X | X |
| | 9 | 6000-series | g | (COOH)$_2$ | 1.5% C | | 43 | Δ | Δ |
| | 10 | | h | H$_3$PO$_4$ + Al(NO$_3$)$_3$ | 3% P + 0.1% N | | 80 | X | X |
| | 11 | | — | — | — | | — | X | X |

*Remarks: Structure of coating: indicated by means of pore diameter
a: top: 20~300 nm: bottom
b: top: 15~200 nm: bottom
c: top: 3~5~10~15 nm: bottom
d: top: 6~180 nm: bottom
e: top: 29~100 nm: bottom
f: top: 18~18 nm: bottom
g: top: 8~8 nm: bottom
h: top: 9~15 nm: bottom As is obvious from the results shown in Table 8, the test pieces Nos. 1 to 7, satisfying the conditions of the present invention, exhibited the excellent resistance to gas corrosion and plasma. On the other hand, the test pieces Nos. 8 to 11, corresponding to the comparative examples and not satisfying one or more conditions of the present invention, exhibited the insufficient resistance to gas corrosion and/or plasma.

The test pieces were tested to evaluate their resistance to gas corrosion and plasma repeating the gas corrosion test and the plasma irradiation test conducted in Example 7, except that the gas corrosion test was conducted at a temperature of 370° C. for 5 hours and the chlorine plasma irradiation test was conducted for 180 minutes. The test results are shown in Table 9.

TABLE 9

| No. | | Kind of Al alloy | Number of layers in porous layer | Structure* of coating | Originally contained compound + added compound | Components contained in coating | Treatment method | Thickness of anodic oxide coating (μm) | Gas corrosion test | Plasma irradiation test |
|---|---|---|---|---|---|---|---|---|---|---|
| Example of present invention | 1 | 5000-series | 2 | a | (COOH)$_2$ + HF | 1.5% C + 0.03% F | anodizing | 17 | ⊚ | ⊚ |
| | 2 | | 3 | b | H$_3$PO$_4$ + HF | 3% P + 0.02% F | | 0.1 | ○ | ○ |
| | 3 | | 3 | b | H$_3$PO$_4$ + HNO$_3$ | 3% P + 0.02% N | | 0.09 | ⊚ | ○ |
| | 4 | 6000-series | 2 | c | H$_2$SO$_4$ + (COOH)$_2$/ H$_3$PO$_4$ + (COOH)$_2$ | 5% S + 0.02% C/ 2% P + 0.02% C | | 30 | ⊚ | ⊚ |
| | 5 | | 4 | d | (COOH)$_2$ + H$_2$SO$_4$ | 1.5% C + 0.04% S | | 3 | ⊚ | ○ |
| | 6 | | 5 | e | (COOH)$_2$ + H$_3$BO$_3$ | 1.5% C + 0.05% B | | 40 | ⊚ | ⊚ |
| Comparative example | 7 | | 2 | f | (COOH)$_2$ | 3% P | | 60 | Δ | Δ |
| | 8 | 5000-series | 1 | g | (COOH)$_2$ | 1.5% C | | 0.02 | X | X |
| | 9 | | — | — | — | — | | — | X | X |

*Structure: pore diameter of each layer
a: top: 8~20 nm/45~160 nm: bottom
b: top: 17~27 nm/35~48 nm/27~150 nm: bottom
c: top: 8~25 nm/57~280 nm: bottom
d: top: 18~27 nm/34~130 nm/110~125 nm/110~280 nm: bottom
e: top: 12~17 nm/35~45 nm/90~100 nm/85~110 nm/85~270 nm: bottom
f: top: 10 nm/25 nm: bottom
g: top: 15 nm: bottom

EXAMPLE 9

As shown in Table 9, various aluminum alloy plates were provided with an anodic oxide coating having different structure from each other. These aluminum alloy plates were used as test pieces. Table 9 also shows the change in the structure of each porous layer by means of a pore diameter, kinds of electrolytic solutions used in anodizing, and the thickness of each anodic oxide coating.

As is obvious from the results shown in Table 9, the test pieces Nos. 1 to 6, satisfying the conditions of the present invention, exhibited the excellent resistance to gas corrosion and plasma. On the other hand, test pieces Nos. 7 to 9, corresponding to the comparative examples and not satisfying one or more conditions of the present invention, exhibited the insufficient resistance to gas corrosion and/or plasma.

EXAMPLE 10

As shown in Table 10, various aluminum alloy plates were used as test pieces, which had a composition satisfying the requirements of Japanese Industrial Standard. The aluminum alloy plates were dissolved in the atmosphere and casted at a rate of 1° C./sec. The resultant was then annealed for homogenization at 480° C. for 4 hours, and after that, was subjected to hot extrusion or hot rolling at 450° C. The reduction rate of thickness by hot rolling was 80% and the extrusion ratio of the hot extrusion was 4.

Using a scanning electron microscope, a cross section of the test pieces was observed to obtain an average diameter of precipitates and/or deposits. Some of test pieces were subjected to image analysis to calculate their volumetric proportion. An average diameter, a volumetric proportion, and an arrangement direction of precipitates and/or deposits are shown in Table 10. In Example 10, an arrangement direction indicates the direction along which precipitates and/or deposits are arranged with respect to the largest area of test piece to which the following gas corrosion resistance test and the plasma resistance test were conducted.

<Gas Corrosion Test>

In order to evaluate the corrosion resistance to a halogen-containing gas for the test pieces, a gas corrosion test was conducted by using 5% of mixed gas of $Cl_2$ and Ar at a temperature of 400° C. for 2 hours. Upon completion of the test, the appearance of test pieces was evaluated under the following standards.

<Gas Corrosion Test>

⊚: No corrosion was generated.

○: Corrosion was generated in an area of less than 10% of test piece.

Δ: Corrosion was generated in an area in the range between 10% or more and less than 20% of test piece.

x: Corrosion was generated in an area of 20% or more of test piece.

In addition, in order to evaluate the resistance to plasma for the test pieces, a chlorine plasma irradiation test was conducted under the low bias. 15 minutes of plasma irradiation was repeated 6 times at 5 minute intervals. Upon completion of the test, the test pieces were evaluated under the standards same as those used for the gas resistance test.

The results of gas corrosion test and the plasma irradiation test are shown in Table 10.

TABLE 10

| No. | | Kind of Al alloy | Pore diameter (anodizing solution) | Coating thickness μm | Average grain diameter (μm)/volumetric proportion (%) | | Arrangement direction | Gas corrosion test | Plasma irradiation test |
|---|---|---|---|---|---|---|---|---|---|
| | | | | | Crystallized particles | Deposited particles | | | |
| Example of present invention | 1 | 2000-series | 20(S)/80(P) | 0.5 | 1/1.0 | 2/1.5 | parallel | ⊚ | ⊚ |
| | 2 | | 20(S)/80(P) | 0.5 | 3/— | 2/— | perpendicular | ○ | ○ |
| | 3 | 5000-series | 10(S)/80(P) | 10 | 4/1.5 | 3/2.5 | parallel | ○ | ⊚ |
| | 4 | | 10(S)/80(P) | 10 | 10/— | 10/— | perpendicular | ○ | ⊚ |
| | 5 | 1000-series | 15/40/80(O) | 2 | 1/0.8 | 2/1.2 | parallel | ⊚ | ⊚ |
| | 6 | | 15/40/80(O) | 2 | 2/0.5 | 1/0.8 | perpendicular | ○ | ⊚ |
| | 7 | 6000-series | 15/40/80(O) | 15 | 3/— | 2/— | parallel | ⊚ | ⊚ |
| | 8 | | 15/40/80(O) | 15 | 8/— | 10/— | parallel | ○ | ○ |
| | 9 | | 15/40/80(O) | 15 | 8/1.5 | 12/1.8 | perpendicular | ○ | ○ |
| | 10 | 1000-series | 10~110(O) | 25 | 3/0.8 | 1/0.8 | parallel | ⊚ | ⊚ |
| | 11 | | 10~110(O) | 25 | 11/2.5 | 8/1.8 | perpendicular | ○ | ○ |
| | 12 | 6000-series | 10~90(S · O) | 2 | 2/— | 1/— | parallel | ⊚ | ⊚ |
| | 13 | | 10~90(S · O) | 2 | 2/1.8 | 3/0.8 | perpendicular | ○ | ○ |
| | 14 | 7000-series | 20~150(O) | 30 | 2/— | 4/— | parallel | ○ | ⊚ |
| | 15 | | 20~150(O) | 30 | 10/1.8 | 10/1.8 | perpendicular | ○ | ○ |
| | 16 | | 20~150(O) | 30 | 10/1.8 | 10/2.0 | parallel | ○ | ⊚ |
| Comparative example | 17 | 1000-series | 15(S) | 7 | 3/0.8 | 3/0.8 | parallel | Δ | Δ |
| | 18 | | 15(S) | 7 | 8/— | 5/— | perpendicular | X | Δ |
| | 19 | 3000-series | 30(S · O) | 10 | 3/— | 2/— | parallel | Δ | ○ |
| | 20 | | 30(S · O) | 10 | 3/— | 2/— | perpendicular | Δ | Δ |
| | 21 | 5000-series | 80(P) | 5 | 4/1.2 | 3/0.8 | parallel | ○ | Δ |
| | 22 | | 80(P) | 5 | 10/2.5 | 10/1.8 | perpendicular | Δ | X |
| | 23 | | 80(P) | 8 | 8/— | 12/— | perpendicular | X | X |
| | 24 | 6000-series | 10(S) | 8 | 2/0.8 | 3/1.2 | parallel | Δ | ○ |
| | 25 | | 10(S) | 8 | 4/1.6 | 6/2.1 | parallel | Δ | ○ |
| | 26 | | 15(S) | 15 | 12/— | 8/— | perpendicular | X | Δ |
| | 27 | | 20(S) | 15 | 12/— | 11/— | perpendicular | X | X |

As is obvious from the results shown in Table 10, the test pieces Nos. 1 to 16, satisfying the conditions of the present invention, exhibited the excellent resistance to gas corrosion and plasma. On the other hand, the test pieces Nos. 17 to 27, corresponding to the comparative examples and not satisfying one or more conditions of the present invention, exhibited the insufficient resistance to gas corrosion and/or plasma.

EXAMPLE 11

As shown in Table 11, various aluminum alloy plates were provided with an anodic oxide coating having different structure from each other by applying electrolytic voltage of various patterns shown in FIGS. 1 and 2. These aluminum alloy plates were used as test pieces.

The patterns A to F shown in FIG. 4 illustrate the preferable electrolytic voltage application in the surface treatment method of the present invention. At least the final voltage is higher than the initial voltage, and the change in electrolytic voltage is continuous. Therefore, the anodic oxide coating produced by applying the electrolytic voltage of patterns A to F corresponds to the examples of the present invention. On the other hand, the pattern G in FIG. 5 illustrates an electrolytic voltage application which is controlled in such a manner that the initial voltage is higher than the final voltage. Therefore, the anodic oxide coating produced by applying the electrolytic voltage of pattern G corresponds to the comparative Example. The pattern H in FIG. 5 illustrates an electrolytic voltage application which is controlled to be constant in the entire anodizing process. Therefore, the anodic oxide coating produced by applying an electrolytic voltage of pattern H corresponds to a conventional example.

Table 11 also shows a composition of anodizing solution, the initial voltage, and the final voltage (also shown are voltages at points where the voltage application are changed in the process of anodizing.).

In order to evaluate the corrosion resistance to a halogen-containing gas for the test pieces, a gas corrosion test was conducted by using 5% of mixed gas of Cl and Ar at a temperature of 300° C. for 4 hours. Upon completion of the test, the appearance of test pieces was evaluated under the following standards.

<Gas Corrosion Test>
- ○: No corrosion was generated.
- Δ: Corrosion was generated in an area of less than 5% of test piece.
- x: Corrosion was generated in an area of 5% or more of test piece.

In addition, in order to evaluate the resistance to plasma of the test pieces, a chlorine plasma irradiation test was conducted under the low bias for 90 minutes. Upon completion of the test, the etched depth of the test pieces was measured and evaluated under the following standards.

<Plasma Irradiation Test>
- ○: Test piece was etched in a depth of less than 2 μm.
- Δ: Test piece was etched in a depth in the range between 2 μm or more and less than 5 μm.
- x: Test piece was etched in a depth of 5 μm or more.

The results of gas corrosion test and the plasma irradiation test are shown in Table 11.

As is obvious from the results shown in Table 11, the test pieces Nos. 1 to 8, satisfying the conditions of the present invention, exhibited the excellent resistance to gas corrosion and plasma. On the other hand, the test pieces Nos. 9 to 13, corresponding to the comparative examples and not satisfying one or more conditions of the present invention, exhibited the insufficient resistance to gas corrosion and/or plasma.

EXAMPLE 12

As shown in Table 12, various aluminum alloy plates were provided with an anodic oxide coating having different structure from each other by applying electrolytic voltage of various patterns shown in FIGS. 6 and 7. These aluminum alloy plates were used as test pieces.

The patterns A to F shown in FIG. 6 illustrate the preferable electrolytic voltage application in the surface treatment method of the present invention. At least the final voltage is higher than the initial voltage, and the change in electrolytic voltage is continuous. Therefore, the anodic oxide coating produced by applying the electrolytic voltage of patterns A to F correspond to the examples of the present invention. On the other hand, the pattern G in FIG. 7 illustrates an electrolytic voltage application which is controlled to be constant in the entire anodizing process, and the pattern H in FIG. 7 illustrates an electrolytic voltage application which is controlled in such a manner that the initial voltage and the final voltage are identical to each other. Therefore, an anodic oxide coating produced by applying an electrolytic voltage of patterns G and H corresponds to a conventional example.

Table 12 also shows a composition of anodizing solution, the initial voltage, and the final voltage (also shown is a voltage value kept constant for an arbitrary period during anodizing.).

Repeating the gas corrosion test and the plasma irradiation test conducted in Example 11, the test pieces were tested to evaluate their resistance to gas corrosion and plasma. The test results are shown in Table 12.

TABLE 11

| No. | | Kind of Al alloy | Voltage pattern | Composition of anodizing solution kind and concentration | Initial voltage~ Final voltage (V) | Gas corrosion test | Plasma irradiation test |
|---|---|---|---|---|---|---|---|
| Example of present invention | 1 | 1000-series | A | sulfuric acid 100 g/l | 5~30 | ○ | ○ |
| | 2 | 2000-series | B | phosphoric acid 40 g/l | 50~100 | ○ | ○ |
| | 3 | 5000-series | C | oxalic acid 60 g/ | 20~60~80 | ○ | ○ |
| | 4 | | D | phosphoric acid 30 g/l | 40~20~120 | ○ | ○ |
| | 5 | 6000-series | A | oxalic acid 10 g/l | 20~60 | ○ | ○ |
| | 6 | | E | oxalic acid 30 g/l | 5~50~20~60~80 | ○ | ○ |
| | 7 | 3000-series | F | oxalic acid 30 g/l | 40~60~20~100 | ○ | ○ |
| | 8 | 6000-series | B | sulfuric acid 150 g/l | 10~20 | Δ | ○ |
| Comparative example | 9 | 5000-series | G | oxalic acid 30 g/l | 80~50 | X | Δ |
| | 10 | | G | sulfuric acid 100 g/l | 20~10 | X | Δ |
| | 11 | 6000-series | H | phosphoric acid 30 g/l | 60 | Δ | X |
| | 12 | 1000-series | H | sulfuric acid 150 g/l | 20 | X | Δ |
| | 13 | 7000-series | — | — | — | X | X |

TABLE 12

| No. | | Kind of Al alloy | Voltage pattern | Composition of anodizing solution kind and concentration | Initial voltage/ Final voltage (V) | Gas corrosion test | Plasma irradiation test |
|---|---|---|---|---|---|---|---|
| Example of present invention | 1 | 1000-series | A | sulfuric acid 150 g/l | 10/30 | ○ | ○ |
| | 2 | 2000-series | B | phosphoric acid 30 g/l | 50/120 | ○ | ○ |
| | 3 | 5000-series | C | oxalic acid 60 g/l | 30/60/80 | ○ | ○ |
| | 4 | | A | sulfuric acid 50 g/l/ phosphoric acid 50 g/l | 20/100 | ○ | ○ |
| | 5 | 6000-series | D | oxalic acid 10 g/l | 20/50/100 | ○ | ○ |
| | 6 | | E | oxalic acid 60 g/l | 20/60/40/80 | ○ | ○ |
| | 7 | 3000-series | F | oxalic acid 30 g/l | 40/20/100 | ○ | ○ |
| | 8 | 6000-series | B | oxalic acid 30 g/l | 60/100 | ○ | Δ |
| Comparative example | 9 | 5000-series | A | sulfuric acid 100 g/l | 20/10 | X | Δ |
| | 10 | | B | oxalic acid 60 g/l | 100/60 | X | Δ |
| | 11 | 6000-series | G | phosphoric acid 30 g/l | 50 | Δ | X |
| | 12 | 1000-series | H | sulfuric acid 150 g/l | 20 | X | Δ |
| | 13 | 7000-series | — | — | — | X | X |

As is obvious from the results shown in Table 12, the test pieces Nos. 1 to 8, satisfying the conditions of the present invention, exhibited the excellent resistance to gas corrosion and plasma. On the other hand, the test pieces Nos. 9 to 13, corresponding to the comparative examples and not satisfying one or more conditions of the present invention, exhibited the insufficient resistance to gas corrosion and/or plasma.

EXAMPLE 13

As shown in Table 13, various aluminum alloy plates were provided with an anodic oxide coating having different structure from each other by applying electrolytic voltage of various patterns shown in FIGS. 4 and 5. These aluminum alloy plates were used as test pieces.

In order to evaluate the corrosion resistance to a halogen-containing gas of the test pieces, a gas corrosion test was conducted by using 5% of mixed gas of Cl and Ar at a temperature of 350° C. for 4 hours. Upon completion of the test, the appearance of test pieces was evaluated under the following standards.

<Gas Corrosion Test>

◎: No corrosion was generated.

○: Corrosion was generated in an area of less than 5% of test piece.

Δ: Corrosion was generated in an area in the range between 5% or more and less than 10% of test piece.

x: Corrosion was generated in an area of 10% or more of test piece.

In addition, in order to evaluate the resistance to plasma of the test pieces, a chlorine plasma irradiation test was conducted under the low bias for 100 minutes. Upon completion of the test, the etched depth of the test pieces was measured and evaluated their resistance to plasma repeating the process of Example 11.

Test results of the gas corrosion test and the plasma irradiation test are shown in Table 13.

TABLE 13

| No. | | Kind of Al alloy | Voltage pattern | Composition of anodizing solution kind and concentration | Initial voltage ~ final voltage (V) | Gas corrosion test | Plasma irradiation test |
|---|---|---|---|---|---|---|---|
| Example of present invention | 1 | 1000-series | A | oxalic acid 60 g/l sulfuric acid 80 g/l | 5~30 | ○ | ○ |
| | 2 | 2000-series | B | oxalic acid 15 g/l phosphorous acid 4 g/l | 50~120 | ◎ | ○ |
| | 3 | 5000-series | C | oxalic acid 3 g/l phosphoric acid 40 g/l | 20~60~80 | ◎ | ○ |
| | 4 | | D | oxalic acid 30 g/l ammonium borate 3 g/l | 40~20~100 | ◎ | ○ |
| | 5 | 6000-series | A | oxalic acid 15 g/l sulfuric acid 3 g/l | 5~75 | ◎ | ○ |
| | 6 | | E | oxalic acid 30 g/l | 5~50~20~60~80 | ○ | ○ |
| | 7 | 3000-series | F | oxalic acid 30 g/l hydrofluoric acid 0.2 g/l | 40~60~20~100 | ○ | ○ |
| | 8 | 6000-series | B | oxalic acid 45 g/l sulfuric acid 50 g/l | 10~20 | Δ | ○ |
| Comparative example | 9 | 5000-series | G | oxalic acid 30 g/l | 80~20 | X | Δ |
| | 10 | | G | oxalic acid 30 g/l hydrofluoric acid 3 g/l | 20~10 | X | X |
| | 11 | 6000-series | H | phosphoric acid 30 g/l | 60 | Δ | X |
| | 12 | 1000-series | H | sulfuric acid 150 g/l phosphoric acid 5 g/l | 15 | X | Δ |
| | 13 | 7000-series | — | — | — | X | X |

As is obvious from the results shown in Table 13, the test pieces Nos. 1 to 8, satisfying the conditions of the present invention, exhibited the excellent resistance to gas corrosion and plasma. On the other hand, the test pieces Nos. 9 to 13, corresponding to the comparative examples and not satisfying one or more conditions of the present invention, exhibited the insufficient resistance to gas corrosion and/or plasma.

EXAMPLE 14

As shown in Table 14, various aluminum alloy plates were provided with an anodic oxide coating having different structure from each other by applying electrolytic voltage of various patterns shown in FIGS. 6 and 7. These aluminum alloy plates were used as test pieces.

Repeating the gas corrosion test and the plasma irradiation test conducted in Example 13, the test pieces were tested to evaluate their resistance to gas corrosion and plasma. The test results are shown in Table 14.

porous type anodizing to be provided with an anodic oxide coating having different structure from each other. These aluminum alloy plates were used as test pieces. Table 15 also shows the structures of each porous layer and each barrier layer and kinds of electrolytic solutions used for anodizing.

In order to evaluate the corrosion resistance to a halogen-containing gas for the test pieces, a gas corrosion test was conducted by using 5% of mixed gas of $Cl_2$ and Ar at a temperature of 350° C. for 4 hours. Upon completion of the test, the appearance of test pieces was evaluated under the following standards.

<Gas Corrosion Test>

○: No corrosion was generated.

Δ: Corrosion was generated in an area of less than 5% of test piece.

x: Corrosion was generated in an area of 5% or more of test piece.

In addition, in order to evaluate the resistance to plasma of the test pieces, a chlorine plasma irradiation test was

TABLE 14

| | No. | Kind of Al alloy | Voltage pattern | Composition of anodizing solution kind and concentration | Initial voltage/ Final voltage (V) | Gas corrosion test | Plasma irradiation test |
|---|---|---|---|---|---|---|---|
| Example of present invention | 1 | 1000-series | A | oxalic acid 15 g/l sulfuric acid 15 g/l | 10/85 | ◎ | ○ |
| | 2 | 2000-series | B | oxalic acid 30 g/l phosphoric acid 30 g/l | 25/120 | ◎ | ○ |
| | 3 | 5000-series | C | oxalic acid 50 g/l | 30/60/80 | ○ | ○ |
| | 4 | | A | oxalic acid 10 g/l sodium nitrate 50 g/l/ oxalic acid 1 g/l phosphorous acid 50 g/l | 10/120 | ◎ | ○ |
| | 5 | 6000-series | D | oxalic acid 10 g/l phosphoric acid 5 g/l | 20/60/90 | ◎ | ○ |
| | 6 | | E | oxalic acid 60 g/l sulfuric acid 10 g/l | 10/30/40/80 | ◎ | ○ |
| | 7 | 3000-series | F | oxalic acid 30 g/l ammonium borate 5 g/l | 45/30/100 | ○ | ○ |
| | 8 | 6000-series | B | oxalic acid 30 g/l hydrofluoric acid 0.5 g/l | 60/100 | ○ | Δ |
| Comparative example | 9 | 5000-series | A | sulfuric acid 100 g/l | 20/10 | X | Δ |
| | 10 | | B | oxalic acid 60 g/l hydrofluoric acid 2 g/l | 80/40 | X | X |
| | 11 | 6000-series | G | phosphoric acid 30 g/l sulfuric acid 2 g/l | 50 | Δ | X |
| | 12 | 1000-series | H | sulfuric acid 120 g/l | 20 | X | Δ |
| | 13 | 7000-series | — | — | — | X | X |

As is obvious from the results shown in Table 14, the test pieces Nos. 1 to 8, satisfying the conditions of the present invention, exhibited the excellent resistance to gas corrosion and plasma. On the other hand, the test pieces Nos. 9 to 13, corresponding to the comparative examples and not satisfying one or more conditions of the present invention, exhibited the insufficient resistance to gas corrosion and/or plasma.

EXAMPLE 15

As shown in Table 15, various aluminum alloy plates were subjected to a porous-type anodizing and/or a nonconducted under the low bias for 90 minutes. Upon completion of the test, the etched depth of the test pieces was measured and evaluated under the following standards.

<Plasma Irradiation Test>

○: Test piece was etched in a depth of less than 2 $\mu$m.

Δ: Test piece was etched in a depth in the range between 2 $\mu$m or more and less than 5 $\mu$m.

x: Test piece was etched in a depth of 5 $\mu$m or more.

The results of the gas corrosion test and the plasma irradiation test are shown in Table 15.

TABLE 15

| No. | | Kind of Al alloy | Structure and kind of coating | | Treatment method | Gas corrosion test | Plasma irradiation test |
|---|---|---|---|---|---|---|---|
| | | | Porous layer | Barrier layer | | | |
| Example of present invention | 1 | 1000-series | 20(15) - S | 0.05 - B | anodizing | ○ | ○ |
| | 2 | | 5(15) - S/5(30) - O | 0.1 - F | | ○ | ○ |
| | 3 | 6000-series | 15(20) - S | 0.05 - B | | ○ | ○ |
| | 4 | | tapered layer - O | 0.15 - F | | ○ | ○ |
| | 5 | | 10(15) - S/5(40) - SO | 0.15 - B | | ○ | ○ |
| | 6 | | 5(30) - O | 0.1 - P | | ○ | ○ |
| | 7 | 5000-series | 15(10) - S/5(10) - O 5(70) - O | 0.1 - B | | ○ | ○ |
| | 8 | | 25(20) - SO | 0.2 - B | | ○ | ○ |
| Comparative Example | 9 | | — | 0.05 - B | | Δ | X |
| | 10 | 6000-series | — | — | — | X | X |
| | 11 | 1000-series | 2(120) - P/10(20) - S | — | anodizing | X | Δ |
| | 12 | | 50(10) - S | — | | X | Δ |

In the column "Structure and kind of coating",
(i) Alphabet capital letters represent:
P: phosphoric acid
S: sulfuric acid
O: oxalic acid
SO: sulfuric acid + oxalic acid
B: boric acid + ammonium borate
F: potassium hydrogen phthalate
(ii) Numbers indicate the thickness of anodic oxide coating(unit μm), where numbers in ( ) indicate pore diameter (unit: nm).
Marks "/" indicate that the structure of porous layer is different between at the top and at the bottom.
(iii) For example, "5(15) - S/5(30) - O" of test piece No. 2 indicates: top of porous layer; thickness of 5 μm (pore diameter of 15 nm) - anodizing solution: sulfuric acid bottom of porous layer; thickness of 5 μm (pore diameter of 30 nm) - anodizing solution: oxalic acid As is obvious from the results shown in Table 1, the test pieces Nos. 1 to 8, satisfying the conditions of the present invention, exhibited the excellent resistance to gas corrosion and plasma. On the other hand, the test pieces Nos. 9 to 12, corresponding to the comparative examples and not satisfying one or more conditions of the present invention, exhibited the insufficient resistance to gas corrosion and/or plasma.

EXAMPLE 16

As shown in Table 16, various aluminum alloy plates were subjected to a porous-type anodizing by applying an electrolytic voltage of various patterns shown in FIGS. 6 and 7, and then were subjected to a non-porous type anodizing. These aluminum alloy plates were used as test pieces. Table 16 also shows kinds of electrolytic solutions and an anodizing voltage used for the porous-type anodizing and the non-porous anodizing.

The resistance to gas corrosion and plasma of test pieces were evaluated repeating the process conducted in Example 15. The test results are shown in Table 16.

TABLE 16

| | No. | Kind of Al alloy | Voltage pattern | anodizing solution porous type/ non-porous type | porous type voltage/ non-porous type voltage (V) | Gas corrosion test | Plasma irradiation test |
|---|---|---|---|---|---|---|---|
| Example of present invention | 1 | 1000-series | G | S/B | 10/200 | ○ | ○ |
| | 2 | 2000-series | C | O/F | 15,20,70/120 | ○ | ○ |
| | 3 | 5000-series | A | S, SO/B | 10,40/150 | ○ | ○ |
| | 4 | | B | SO/F | 20,80/100 | ○ | ○ |
| | 5 | 6000-series | H | P/B | ~60/200 | ○ | ○ |
| | 6 | | A | S, O/B | 20,40/250 | ○ | ○ |
| | 7 | 3000-series | G | SO/B | 20/150 | ○ | ○ |
| | 8 | 6000-series | D | SO, O/F | 10(S0, 30(0) 90(0)/350 | ○ | Δ |
| Comparative example | 9 | 5000-series | G | S | 10 | X | Δ |
| | 10 | | H | SO | ~40 | X | Δ |
| | 11 | 6000-series | C | P/S | 10,20,40/20 | Δ | X |
| | 12 | 1000-series | A | S | 15,30 | X | Δ |
| | 13 | 7000-series | — | — | — | X | X |

As is obvious from the results shown in Table 16, the test pieces Nos. 1 to 8, satisfying the conditions of the present invention, exhibited the excellent resistance to gas corrosion and plasma. On the other hand, the test pieces Nos. 9 to 13, corresponding to the comparative examples and not satisfying one or more conditions of the present invention, exhibited the insufficient resistance to gas corrosion and/or plasma.

EXAMPLE 17

As shown in Table 17, various aluminum alloy plates were used as test pieces, which had a composition satisfying the requirements of Japanese Industrial Standard. The aluminum alloy plates were dissolved in the atmosphere and casted at a rate of 1° C./sec. The resultant was then annealed for homogenization at 480° C. for 4 hours, and after that, was subjected to hot extrusion or hot rolling at 450° C. The reduction rate of thickness by hot rolling was 80% and the extrusion ratio of the hot extrusion was 4.

Using a scanning electron microscope, a cross section of the test pieces was observed to obtain an average diameter of precipitates and/or deposits. The test pieces were subjected to image analysis to calculate their volumetric proportion. An average diameter, a volumetric proportion, and an arrangement direction of precipitates and/or deposits are shown in Tables 17 and 18. In Example 17, an arrangement direction indicates the direction along which precipitates and/or deposits are arranged with respect to the largest area of test piece to which the gas corrosion resistance test and the plasma resistance test were conducted.

⊙: Test piece was penetrated by chlorine in a depth of less than 30 μm at maximum.

○: Test piece was penetrated by chlorine in a depth in the range between 30 μm or more and less than 50 μm.

Δ: Test piece was penetrated by chlorine in a depth in the range between 50 μm or more and less than 100 μm.

x: Test piece was penetrated by chlorine in a depth of 100 μm or more.

<Plasma Resistance Test>

In addition, in order to evaluate the resistance to plasma of the test pieces, a chlorine plasma irradiation test was conducted under the low bias for 15 minutes. Upon completion of the test, the maximum depth of the chlorine penetration of the test pieces was measured and evaluated under the same standards as those used for the gas resistance test.

The results of the gas corrosion test and the plasma irradiation test are shown in Tables 17 and 18.

TABLE 17

| No. | Kind of Al alloy | Average diameter (μm)/ volumetric proportion (%) | | Arrangement direction | Gas corrosion test | Plasma irradiation test | Remarks |
|---|---|---|---|---|---|---|---|
| | | Crystallized particles | Deposited particles | | | | |
| 1 | 1000-series | 2/0.6 | 2/1.0 | parallel | ⊙ | ⊙ | Example |
| 2 | | 5/1.3 | 7/2.0 | parallel | ⊙ | ○ | of |
| 3 | | 2/1.0 | 1/0.8 | perpendicular | ⊙ | ⊙ | present |
| 4 | 2000-series | 4/1.0 | 2/1.0 | parallel | ⊙ | ⊙ | invention |
| 5 | 3000-series | 6/2.5 | 5/2.0 | parallel | ○ | ○ | |
| 6 | 5000-series | 2/1.0 | 2/1.0 | parallel | ⊙ | ⊙ | |
| 7 | | 6/2.0 | 2/2.0 | parallel | ⊙ | ○ | |
| 8 | | 3/1.0 | 2/1.5 | perpendicular | ○ | ○ | |
| 9 | | 8/3.0 | 8/2.5 | parallel | ○ | ○ | |
| 10 | | 2/5.0 | 1/3.0 | perpendicular | ○ | ○ | |
| 11 | 6000-series | 4/3.0 | 3/1.0 | parallel | ○ | ○ | |
| 12 | | 6/2.0 | 5/0.8 | parallel | ○ | ○ | |
| 13 | | 1/1.0 | 1/0.2 | parallel | ⊙ | ⊙ | |
| 14 | | 2/0.5 | 0.8/0.8 | perpendicular | ⊙ | ⊙ | |
| 15 | | 5/1.2 | 1.5/1.5 | parallel | ⊙ | ⊙ | |
| 16 | 7000-series | 3/1.0 | 3/1.5 | parallel | ⊙ | ○ | |
| 17 | | 5/1.2 | 2/0.8 | parallel | ⊙ | ○ | |

TABLE 18

| No. | Kind of Al alloy | Average diameter (μm)/ volumetric proportion (%) | | Arrangement direction | Gas corrosion test | Plasma irradiation test | Remarks |
|---|---|---|---|---|---|---|---|
| | | Crystallized particles | Deposited particles | | | | |
| 18 | 1000-series | 2/1.5 | 11/0.5 | perpendicular | X | Δ | Comparative |
| 19 | 2000-series | 6/3.0 | 3/4.0 | perpendicular | X | Δ | example |
| 20 | 5000-series | 11/3.0 | 7/3.0 | perpendicular | X | X | |
| 21 | | 11/4.0 | 10/1.5 | perpendicular | X | X | |
| 22 | 6000-series | 11/2.0 | 11/2.0 | perpendicular | X | X | |
| 23 | | 12/1.0 | 3/0.8 | perpendicular | Δ | X | |
| 24 | | 15/0.8 | 12/0.8 | perpendicular | X | X | |
| 25 | 7000-series | 12/2.0 | 4/3.5 | perpendicular | X | X | |

<Gas Corrosion Test>

In order to evaluate the corrosion resistance to a halogen-containing gas for the test pieces, a gas corrosion test was conducted by using 5% of mixed gas of $Cl_2$ and Ar at a temperature of 130° C. for 1 hour. Upon completion of the test, the maximum depth of the chlorine penetration of the test pieces was measured and evaluated under the following standards.

As is obvious from the results shown in Tables 17 and 18, the test pieces Nos. 1 to 17, satisfying the conditions of the present invention, exhibited the excellent resistance to gas corrosion and plasma. On the other hand, the test pieces Nos. 18 to 25, corresponding to the comparative examples and not satisfying one or more conditions of the present invention, exhibited the insufficient resistance to gas corrosion and/or plasma.

EXAMPLE 18

As shown in Table 19, various aluminum alloy plates were subjected to surface treatment. These aluminum alloy plates were used as test pieces. In Example 18, a corrosion test was conducted under the conditions more severe than those used in Example 17, and the resistance to gas corrosion and plasma of the test pieces was evaluated.

<Gas Corrosion Test>

In order to evaluate the corrosion resistance to a halogen-containing gas of the test pieces, a gas corrosion test was conducted by using 5% of mixed gas of $Cl_2$ and Ar at a temperature of 350° C. for 4 hours. Upon completion of the test, the corroded area of test pieces was measured and evaluated under the following standards.

⊚: Corrosion was generated in an area of less than 5%.

○: Corrosion was generated in an area in the range between 5% or more and less than 10% of test piece.

Δ: Corrosion was generated in an area in the range between 10% or more and less than 20% of test piece.

x: Corrosion was generated in an area of 20% or more of test piece.

<Plasma Irradiation Test>

In order to evaluate the resistance to plasma of the test pieces, a chlorine plasma irradiation test was conducted under the low bias. 15 minutes of plasma irradiation was repeated 6 times at 5 minute intervals. Upon completion of the test, the corroded area of the test pieces was measured and evaluated under the same standards as those used for gas corrosion test.

The results of the gas corrosion test and the plasma irradiation test are shown in Table 19.

arranged in parallel with the largest surface thereof. All of the test pieces a to d of Nos. 1 to 5 exhibited the excellent resistance to gas corrosion and plasma. Contrary to this, the test pieces d of Nos. 1 to 5, corresponding to the comparative examples and not satisfying the conditions of the present invention, exhibited the insufficient resistance to gas corrosion and/or plasma.

INDUSTRIAL APPLICABILITY

As has been described above, the first and second inventions provide a vacuum chamber made of aluminum or its alloy having remarkably enhanced resistance to gas corrosion and plasma, and a surface treatment method for the vacuum chamber. The third invention provides the aluminum alloy material for the vacuum chamber to achieve excellent resistance to gas corrosion and plasma.

What is claimed is:

1. A vacuum chamber or chamber part made of aluminum or aluminum alloys comprising an anodic oxide coating including a porous layer having a number of pores and a barrier layer without pores, the pores having an opening on a surface of the chamber or chamber part, the diameter of the pore being smaller at a top thereof than at a bottom thereof.

2. A vacuum chamber or chamber part made of aluminum or aluminum alloys according to claim 1, wherein the pore in the porous layer has a section in a depth direction thereof where its diameter continuously changes.

3. A vacuum chamber or chamber part made of aluminum or aluminum alloys according to claim 1, wherein the pore in the porous layer has a section in a depth direction thereof where its diameter discontinuously changes.

4. A vacuum chamber or chamber part made of aluminum or aluminum alloys according to claim 2 or 3, wherein the

TABLE 19

| No. | | Kind of Al alloy | Average diameter (μm)/ volumetric proportion (%) | | Arrangement direction | Surface treatment method a Kind of coating b Coating thickness | Gas corrosion test | Plasma irradiation test |
|---|---|---|---|---|---|---|---|---|
| | | | Crystallized particles | Deposited particles | | | | |
| 1 | a | 5000-series | 6/1 | 3/1 | parallel | sputtering | ⊚ | ⊚ |
| | b | | 2/0.3 | 1/0.8 | perpendicular | a Al2O3 | ⊚ | ⊚ |
| | c | | 10/3 | 4/2 | parallel | b 2 μm | ○ | ○ |
| | d | | 11/— | 10/— | perpendicular | | X | X |
| 2 | a | 6000-series | 4/1.2 | 2/1.5 | parallel | detonation flame | ⊚ | ⊚ |
| | b | | 6/1.5 | 3/2.5 | perpendicular | spraying | ○ | ○ |
| | c | | 11/4.0 | 1/0.8 | parallel | a Al2O3 | ○ | ○ |
| | d | | 12/5.0 | 3/2.5 | perpendicular | b 25 μm | X | X |
| 2 | a | 1000-series | 2/1 | 1/1 | parallel | sputtering | ⊚ | ⊚ |
| | b | | 4/2.5 | 2/2.0 | perpendicular | a TiO2 | ○ | ○ |
| | c | | 2/4.2 | 8/2.5 | parallel | b 2 μm | ○ | ⊚ |
| | d | | 11/0.3 | 1/0.3 | perpendicular | | X | X |
| 4 | a | 6000-series | 4/1 | 2/4 | parallel | anodizing | ⊚ | ⊚ |
| | b | | 4/3.0 | 2/3.0 | perpendicular | a oxide layer | ○ | ○ |
| | c | | 8/0.5 | 4/1.2 | parallel | b 20 μm | Δ | ○ |
| | d | | 12/5 | 3/0.3 | perpendicular | | X | X |
| 5 | a | 1000-series | 2/1 | 1/0.8 | parallel | sputtering | ⊚ | ⊚ |
| | b | | 4/1 | 2/0.2 | perpendicular | a AlN | ○ | ⊚ |
| | c | | 4/0.3 | 11/1.5 | parallel | b 1.5 μm | Δ | ○ |
| | d | | 12/0.3 | 12/0.3 | perpendicular | | X | X |

As shown in Table 19, the test pieces a of Nos. 1 to 5 had precipitates and/or deposits having an average diameter of 10 μm or less and being arranged in parallel with the largest surface thereof. The test pieces b of Nos. 1 to 5 had precipitates and/or deposits having an average diameter of 10 μm or less and being arranged in perpendicular to the largest surface thereof. The test pieces c of Nos. 1 to 5 had precipitates and/or deposits either of which had an average diameter of more than 10 μm, but both of which were pore in the porous layer has a section in a depth direction thereof where its diameter remains constant.

5. A vacuum chamber or chamber part made of aluminum or its alloys according to any one of claims 1 to 3, wherein the anodic oxide coating contains two or more elements selected from a group consisting of carbon, sulfur, nitrogen, phosphorus, fluorine and boron.

6. A vacuum chamber or chamber part made of aluminum or aluminum alloys according to any one of claims 1 to 3, wherein a base material contains particles of precipitates and/or deposits having a diameter of 10 μm or less in average.

7. A vacuum chamber or chamber part made of aluminum or its alloys according to any of claims 1 to 3, wherein the particles of precipitates and/or deposits are arranged in parallel with a largest surface of the base material.

8. A vacuum chamber or chamber part made of aluminum or its alloys according to any of claims 1 to 3, wherein the base material contains the particles of precipitates and/or deposits having a diameter of 10 μm or less in average, and the precipitates and/or deposits are arranged in parallel with a largest surface of the base material.

9. A vacuum chamber or chamber part made of aluminum or aluminum alloys according to claim 1, wherein the pore diameter at the top is 80 nm or less.

10. A vacuum chamber or chamber part made of aluminum or aluminum alloys according to claim 1, wherein the pore diameter at the top is 50 nm or less.

11. A vacuum chamber or chamber part made of aluminum or aluminum alloys according to claim 1, wherein the pore diameter at the top is 30 nm or less.

12. A vacuum chambers or chamber part made of aluminum or aluminum alloys according to claim 1, wherein the thickness of the anodic oxide coating is 0.05 μm or more.

13. A vacuum chambers or chamber part made of aluminum or aluminum alloys according to claim 1, wherein the thickness of the anodic oxide coating is 0.01 μm or more.

14. A vacuum chambers or chamber part made of aluminum or aluminum alloys according to claim 1, wherein the thickness of the anodic oxide coating is 0.05 to 50 μm.

15. A vacuum chambers or chamber part made of aluminum or aluminum alloys according to claim 1, wherein the thickness of the anodic oxide coating is 0.1 to 50 μm.

16. A vacuum chambers or chamber part made of aluminum or aluminum alloys according to claim 1, wherein the thickness of the barrier layer is 50 μm or more.

17. A vacuum chambers or chamber part made of aluminum or aluminum alloys according to claim 1, wherein the thickness of the barrier layer is 80 μm or more.

18. A method for anodizing a surface of a vacuum chamber made of aluminum or aluminum alloys, wherein a final anodizing voltage is set to be higher than an initial anodizing voltage.

19. A method according to claim 18, wherein the anodizing voltage is continuously changed for an arbitrary period.

20. A method according to claim 18, wherein the anodizing voltage is discontinuously changed for an arbitrary period.

21. A method according to claim 19 or 20, wherein the anodizing voltage is kept constant for an arbitrary period.

22. A method according to any one of claims 18 to 20, wherein the initial anodizing voltage is 50V or less.

23. A method according to any one of claims 18 to 20, wherein the final anodizing voltage is 30V or more.

24. A method according to any one of claims 18 to 20, wherein an oxalic acid solution is used as an anodizing solution 1 gram or more of oxalic acid being contained per 1 liter of solution.

25. A method according to claim 24, wherein one or more elements selected from a group consisting of sulfur, nitrogen, phosphorus, fluorine and boron are added to the anodizing solution.

26. A method for anodizing a vacuum chamber and chamber parts made of aluminum or aluminum alloys to form an anodic oxide coating including a porous layer having a number of pores and a barrier layer having no pores, the method comprises a step of performing a porous anodizing and a step of performing a non-porous anodizing, and the non-porous anodizing is performed after the completion of the porous anodizing.

27. A surface treatment for a vacuum chamber and chamber parts made of aluminum or aluminum alloys according to claim 26, wherein a final porous anodizing voltage is set to be higher than an initial porous anodizing voltage.

28. A surface treatment for a vacuum chamber and chamber parts made of aluminum or aluminum alloys according to claim 26 or 27, wherein a porous anodizing voltage is continuously changed for an arbitrary period.

29. A surface treatment for a vacuum chamber and chamber parts made of aluminum or aluminum alloys according to claim 27, wherein a porous anodizing voltage is discontinuously changed for an arbitrary period.

30. A surface treatment for a vacuum chamber and chamber parts made of aluminum or aluminum alloys according to claim 27, wherein a porous anodizing voltage is continuously changed for an arbitrary period in the entire porous anodizing process, and is discontinuously changed for the other arbitrary period.

31. A surface treatment for a vacuum chamber and chamber parts made of aluminum or aluminum alloys according to any one of claims 26, 27, 29 and 30, wherein the initial porous anodizing voltage is 50V or less.

32. A surface treatment for a vacuum chamber and chamber parts made of aluminum or aluminum alloys according to any one of claims 26, 27, 29 and 30, wherein the final porous anodizing voltage is 30V or more.

33. A material used for manufacturing a vacuum chamber and chamber parts made of an aluminum alloy comprising precipitates and/or deposits having a diameter of 10 μm or less in average, thereby giving excellent resistance to gas corrosion and plasma.

34. A material used for manufacturing a vacuum chamber and chamber parts made of an aluminum alloy comprising precipitates and/or deposits arranged in parallel with a largest surface of the base, thereby giving excellent resistance to gas, corrosion and plasma.

35. A material used for manufacturing a vacuum chamber and chamber parts made of aluminum alloy comprising precipitates and/or deposits have a diameter of 10 μm or less in average, and at the same time, the precipitates and/or deposits arranged in parallel with a largest surface of the base, thereby giving excellent resistance to gas, corrosion and plasma.

36. A material used for manufacturing a vacuum chamber and chamber parts according to any one of claims 33 to 35, wherein the volumetric proportion of the precipitates and/or the deposits is 2% or less.

37. A material used for manufacturing a vacuum chamber and chamber parts according to any one of claims 33 to 35, wherein said precipitates and/or deposits comprise at least one of magnesium, silicon, copper or iron.

* * * * *